United States Patent
Kitagawa et al.

(10) Patent No.: US 7,916,556 B2
(45) Date of Patent: Mar. 29, 2011

(54) SEMICONDUCTOR MEMORY DEVICE, SENSE AMPLIFIER CIRCUIT AND MEMORY CELL READING METHOD USING A THRESHOLD CORRECTION CIRCUITRY

(75) Inventors: Makoto Kitagawa, Kanagawa (JP); Wataru Otsuka, Tokyo (JP)

(73) Assignee: Sony Corporation, Tokyo (JP)

( * ) Notice: Subject to any disclaimer, the term of this patent is extended or adjusted under 35 U.S.C. 154(b) by 297 days.

(21) Appl. No.: 11/984,813

(22) Filed: Nov. 21, 2007

(65) Prior Publication Data

US 2008/0165592 A1      Jul. 10, 2008

(30) Foreign Application Priority Data

Jan. 9, 2007  (JP) ................................ 2007-001548
May 2, 2007  (JP) ................................ 2007-121404

(51) Int. Cl.
  *G11C 7/06*  (2006.01)
(52) U.S. Cl. ......... 365/189.15; 365/189.07; 365/189.09; 365/189.11; 365/190; 365/208; 365/207
(58) Field of Classification Search .................. 365/158, 365/173, 171, 209, 208, 207, 190, 189.15, 365/148, 163, 189.07, 189.09, 189.11, 203
See application file for complete search history.

(56) References Cited

U.S. PATENT DOCUMENTS 6,879,524 B2 * 4/2005 Monzel ..................... 365/189.05
2004/0109361 A1 * 6/2004 Eby et al. ................. 365/189.09

FOREIGN PATENT DOCUMENTS

| JP | 08-102196 | 4/1996 |
| JP | 2002-133857 | 5/2002 |
| JP | 2002-197853 | 7/2002 |
| JP | 2003-17782 | 1/2003 |
| JP | 2003-529879 | 10/2003 |
| JP | 2004-103212 | 4/2004 |
| JP | 2006-196612 | 7/2006 |

OTHER PUBLICATIONS

Japanese Office Action issued Feb. 17, 2009 for corresponding Japanese Appliction No. 2007-121404.

* cited by examiner

*Primary Examiner* — Andrew Q Tran
(74) *Attorney, Agent, or Firm* — Rader, Fishman & Grauer PLLC

(57) ABSTRACT

A semiconductor memory device includes: a memory cell; a sense line; and a sense amplifier circuit connected to the memory cell via the sense line. The sense amplifier circuit includes a differential sense amplifier, a pull-up section, a read gate transistor, and a threshold correction section.

15 Claims, 22 Drawing Sheets

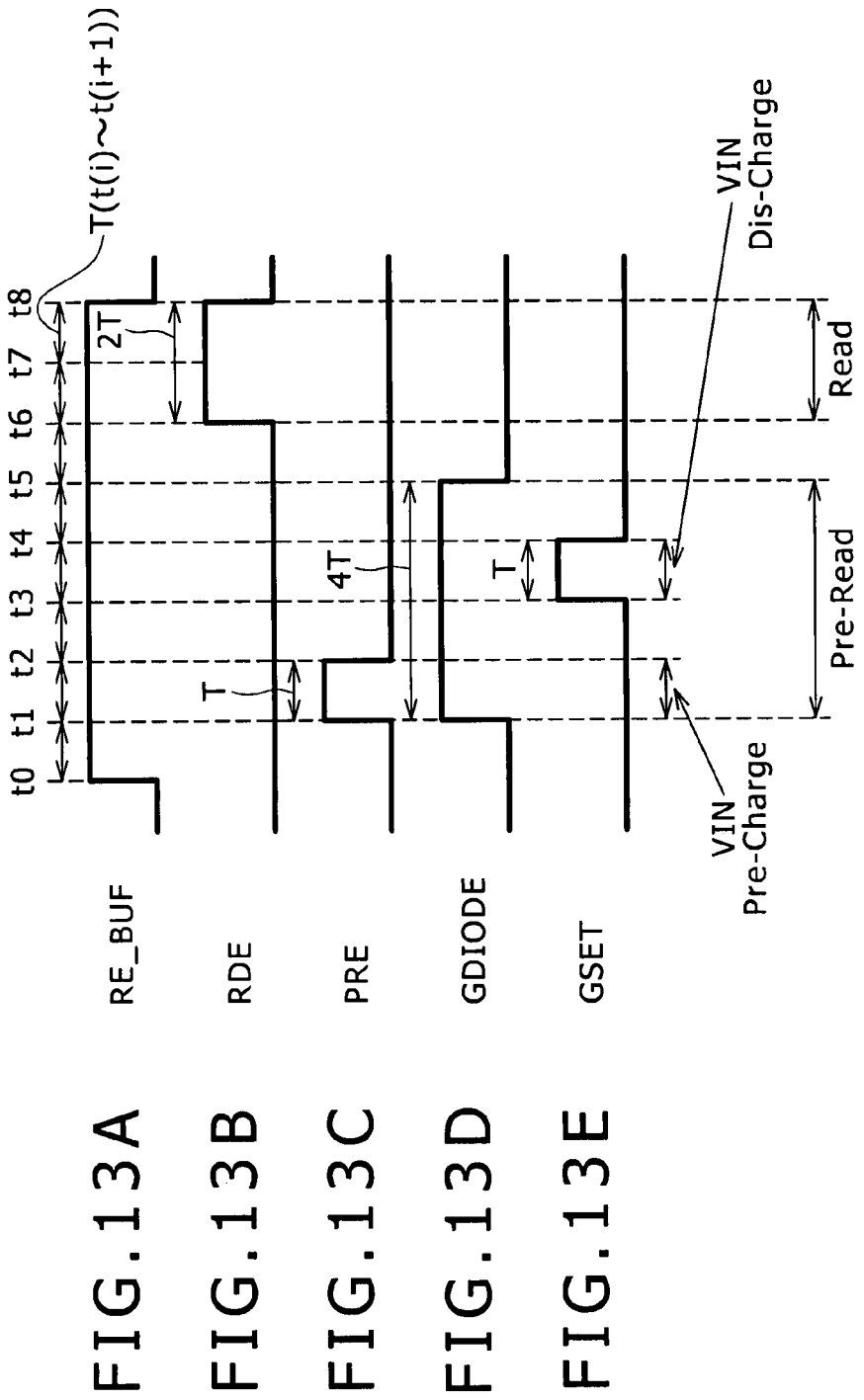

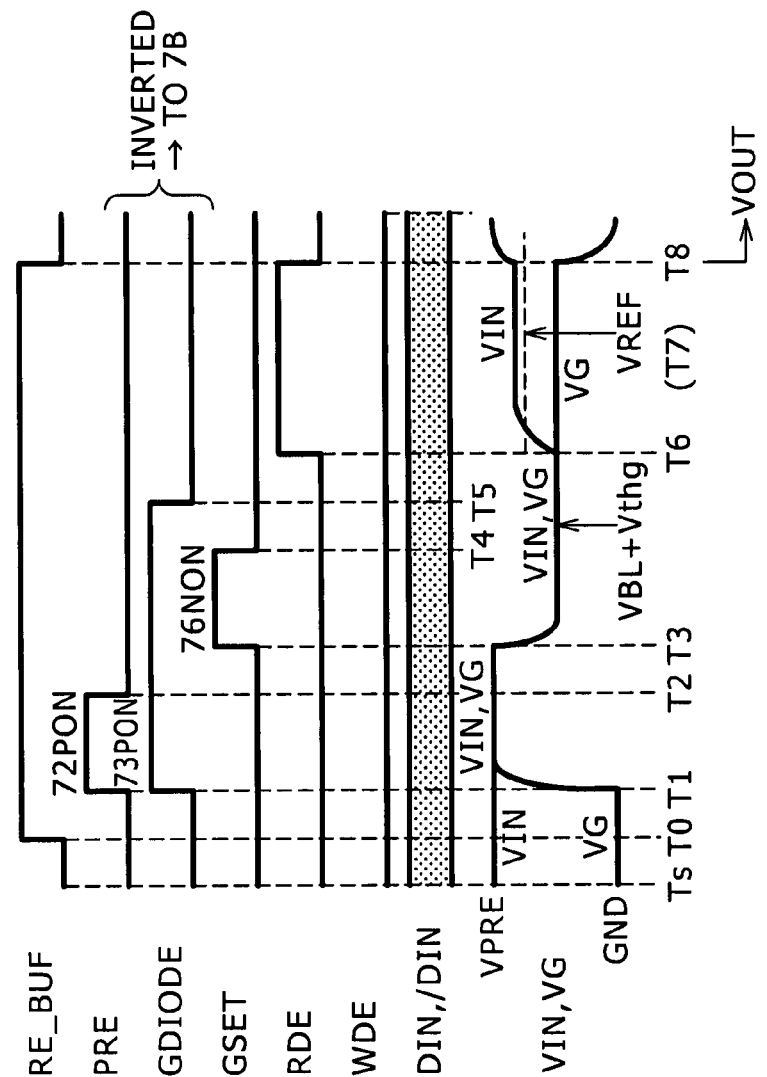

DISCHARGED (T3)

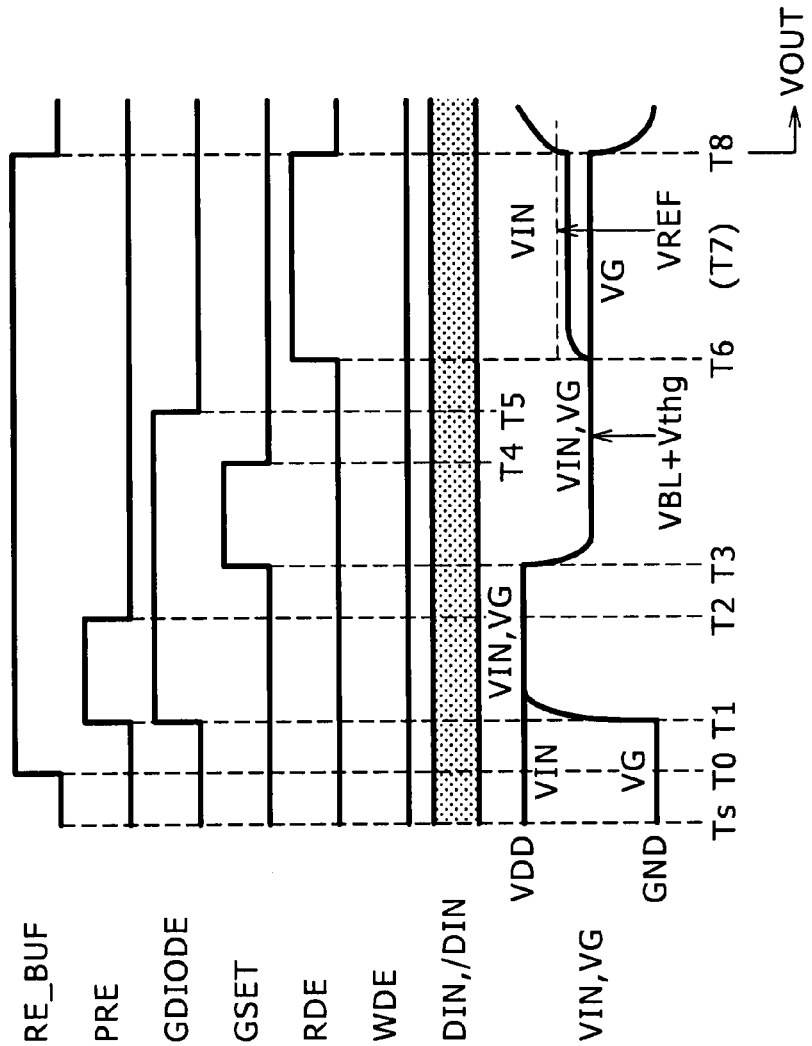

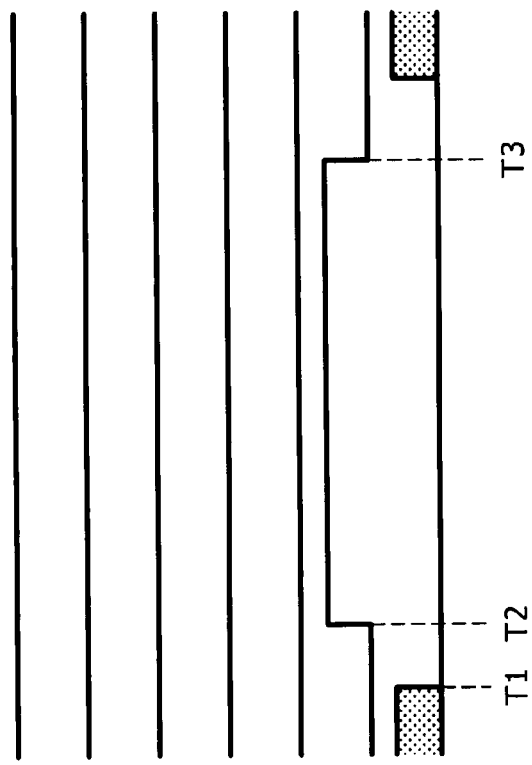
FIG.21A  RE_BUF
FIG.21B  PRE
FIG.21C  GDIODE
FIG.21D  GSET
FIG.21E  RDE
FIG.21F  WDE
FIG.21G  DIN
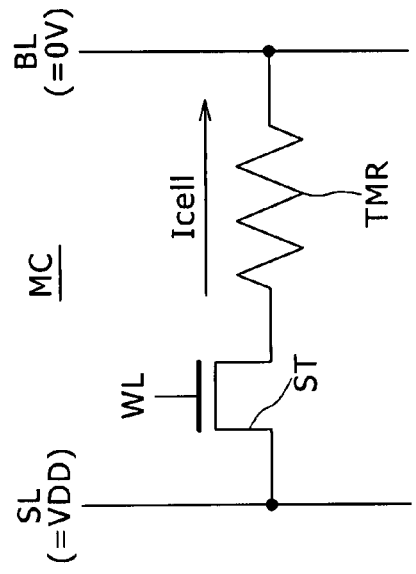
FIG.22

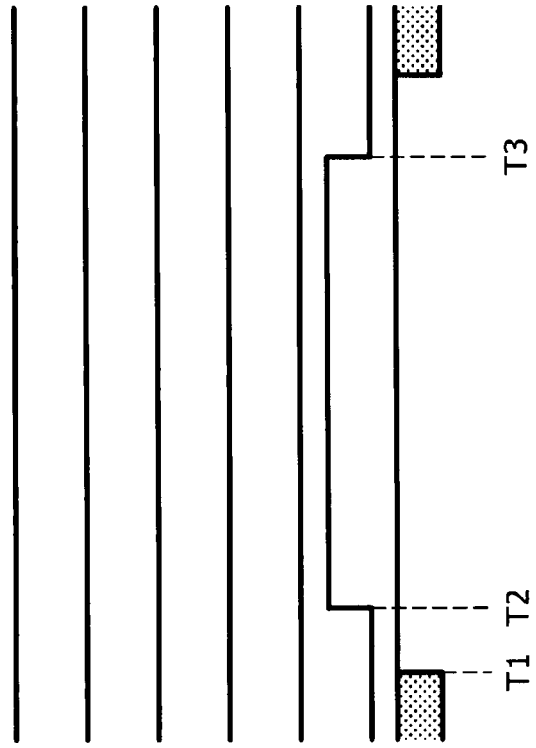
FIG.23A RE_BUF
FIG.23B PRE
FIG.23C GDIODE
FIG.23D GSET
FIG.23E RDE
FIG.23F WDE
FIG.23G DIN
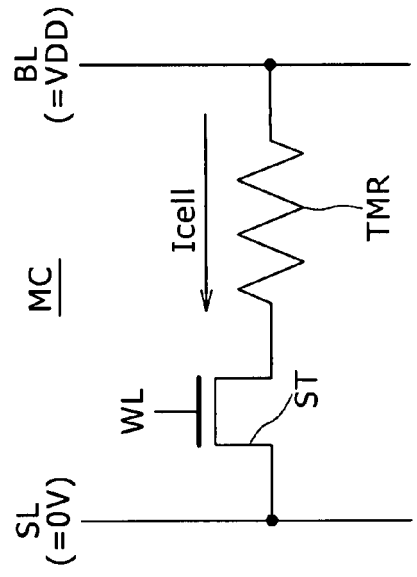
FIG.24

SEMICONDUCTOR MEMORY DEVICE, SENSE AMPLIFIER CIRCUIT AND MEMORY CELL READING METHOD USING A THRESHOLD CORRECTION CIRCUITRY

CROSS REFERENCES TO RELATED APPLICATIONS

The present invention contains subject matter related to Japanese Patent Application JP 2007-121404, and JP 2007-001548 both filed with the Japan Patent Office on May 2, 2007, and on Jan. 9, 2007 respectively the entire contents of which being incorporated herein by reference.

BACKGROUND OF THE INVENTION

1. Field of the Invention

The present invention relates to a semiconductor memory device which includes a sense amplifier circuit connected to a memory cell via a sense line, a sense amplifier circuit suitable for reading the memory cell of the semiconductor memory device, and a memory cell reading method.

2. Description of the Related Art

In semiconductor memory devices, the magnitude of a cell current varies depending on the storage status of a memory cell. Stored data associated with the magnitude of the cell current is read. Recent years have seen progress in nonvolatile memory development.

Well known among two-terminal variable resistance type nonvolatile memories is spin injection memory (refer to Japanese Patent Laid-Open No. 2003-17782P and Japanese Patent Laid-Open No. 2006-196612).

Spin injection memory employs a phenomenon in which the magnetized state of a magnetic substance changes by interaction between a spin-polarized conduction electron injected into the magnetic substance and electron spin responsible for the magnetization of the magnetic substance.

A description will be made about a tunnel magnetoresistance element (hereinafter TMR) which is a memory element.

The tunnel magnetoresistance element TMR basically has a layered structure which includes two magnetic substance layers separated by a tunnel barrier layer 101 as illustrated in FIG. 1.

One of the magnetic substance layers is a fixed magnetization layer 102 designed so that the magnetized condition remains unchanged. The other magnetic substance layer is a free magnetization layer 103 designed so that a stable magnetized state is obtained in the direction parallel or non-parallel to the magnetization direction of the fixed magnetization layer 102.

A laminated film having two magnetic substance layers (fixed magnetization layer 102 and free magnetization layer 103) exhibits a magnetoresistance effect (MR effect) which causes a change in conductance according to the angle formed between the magnetization directions of the two layers. Stored data is read by applying a voltage across two terminals of this laminate so that a current is output. The magnitude of the output current depends upon the resistance which varies according to the magnetization direction of the free magnetization layer 103 due to the MR effect. The MR effect produced by a tunnel current flowing through the tunnel magnetoresistance element TMR is referred to as the TMR effect.

FIG. 2 illustrates a cell configuration in a spin injection memory using the tunnel magnetoresistance element TMR. FIG. 3 illustrates an equivalent circuit diagram of a memory cell.

A diagrammatically illustrated memory cell MC has the tunnel magnetoresistance element TMR and a select transistor ST.

One end of the tunnel magnetoresistance element TMR is connected to a bit line BL, and the other end thereof to the drain of the select transistor ST. The source of the select transistor ST is connected to a source line SL, and the gate thereof to a word line WL.

Next, a description will be made about electrical characteristics of the tunnel magnetoresistance element TMR.

In the tunnel magnetoresistance element TMR, a tunnel current flow produces a magnetization switching (referred to as spin injection magnetization switching). This leads to a change in electrical memory characteristic, namely, resistance hysteresis characteristic.

FIG. 4 illustrates a current vs voltage characteristic (hysteresis characteristic) of the tunnel magnetoresistance element TMR. Referring to FIG. 1, the direction of current flow from the fixed magnetization layer 102 to the free magnetization layer 103 is the positive direction of cell current in FIG. 4. A cell-applied voltage along the horizontal axis in FIG. 4 gives a positive or negative voltage to the fixed magnetization layer 102 relative to the potential of the free magnetization layer 103.

The electrical characteristic illustrated exhibits the low resistance state with a relatively large slope after crossing the zero current and the high resistance state with a relatively small slope after crossing the zero current. If the cell-applied voltage is increased in the low resistance state, a state change (transition to high resistance) takes place as shown by an arrow Ah in FIG. 4, for example, when the cell-applied voltage is between 0.5 and 1.0 V. On the other hand, if the cell-applied voltage is reduced in the high resistance state, another state change (transition to low resistance) takes place as shown by an arrow Al in FIG. 4, for example, when the cell-applied voltage is between −0.5 and −1.0 V.

The cell operation is controlled to bring about a transition to the high resistance state by setting the cell-applied voltage to 1.0 V and a transition to the low resistance state by setting the cell-applied voltage to −1.0 V.

It is clear that if, based on the above electrical characteristic, the two states are associated with binary data, it is possible to write data to the memory because data inversion is possible. More specifically, data "0" can be written (Write0) by setting the cell-applied voltage to 1.0 V. Conversely, data "1" can be written (Write1) by setting the cell-applied voltage to −1.0 V.

In the memory read operation, a potential of about 0.3 V is, for example, applied to the memory cell to achieve a substantially high magnetoresistance ratio (MR ratio). At this time, the resistance of the tunnel magnetoresistance element TMR varies depending on the write state. Therefore, it is possible to determine whether the TMR is in the high resistance state (data "0" being written) or low resistance state (data "1" being written) by reading the resistance value.

Although the above description applies to a case where the read operation is performed on the Write0 (transition to high resistance) side, the read operation is also possible on the Write1 (transition to low resistance) side, for example, by applying a voltage of about −0.3 V to the memory cell.

At this time, the larger the difference between read resistance values, the easier it is to discriminate between data "0" and data "1." Therefore, the larger the absolute value of the voltage applied to the cell during write operation (read voltage), the better. However, increasing the absolute value of the read voltage may make it difficult to provide for a margin of a transition voltage capable of producing a state transition, possibly resulting in erroneous write of a memory cell connected to the same bit line (read disturb). To prevent a read disturb, the cell-applied voltage must be controlled with precision during read operation. Further, if the MR ratio has a dependence on cell-applied voltage, the optimal MR ratio must be achieved before proceeding with read operation.

Under these circumstances, a technique is known which produces a sense amplifier reference voltage from a memory cell having the tunnel magnetoresistance element TMR (or reference cell) in order to secure a read disturb margin (e.g., Japanese Patent Laid-Open No. 2002-197853, hereinafter referred to as Patent Document 3).

In Patent Document 3, the cell-applied voltage is controlled by inserting a voltage gate transistor (V-gate Tr. (NMOS)) between a sense node and a bit line. This transistor functions as voltage control means to cause a voltage drop. Then, a bit line voltage applied to the cell is controlled by setting the gate voltage of the voltage gate transistor to VBIAS (intermediate voltage between Vdd and GND potential).

FIG. 5 illustrates part of a column circuit to which the technique of the above Patent Document 3, for example, is applicable.

In the diagrammatically illustrated column circuit, the memory cell MC with an MR element is connected between the source line SL maintained at the GND potential and the bit line BL. Further, a voltage gate transistor Mn (V-gate Tr. (NMOS)) is connected between the bit line BL and the supply line of a source voltage Vdd. Although not specifically illustrated, a voltage generating circuit adapted to generate a reference voltage is connected to the gate of the voltage gate transistor Mn. The voltage generating circuit has a reference cell which models after the memory cell and has half the MR ratio of the memory cell. This circuit is used to generate VBIAS which is applied to the gate of the voltage gate transistor Mn.

This column circuit is provided for each column of a memory cell array. Two types of column circuits are formed adjacent to each other as a pair, one column circuit to which VBIAS is applied and another in which voltage is not so much controlled by the voltage gate transistor. A sense amplifier is connected between the bit lines of the two column circuits to perform a read operation.

As an example of canceling the impact of variation in characteristics of the transistor which functions as a switch to apply a voltage to a bit line, there is a method of controlling the transistor gate voltage using a negative feedback amplifier (e.g., Japanese Patent Laid-Open No. 2004-103212 and Japanese Patent Laid-Open No. 2003-529879, hereinafter referred to as Patent Documents 4 and 5).

FIG. 6 illustrates the schematic configuration given in the Patent Document 4.

In the diagrammatically illustrated circuit, the memory cell MC with the MR element is connected between the source line SL maintained at the GND potential and the bit line BL. Further, the NMOS transistor Mn (V-gate Tr.) and a current source IS are connected between the bit line BL and the supply line of the source voltage Vdd.

The output of a negative feedback amplifier NFA is connected to the gate of the NMOS transistor Mn. The inverted input "−" of the negative feedback amplifier NFA is connected to the source of the NMOS transistor Mn, whereas a potential Vmtj is applied to the non-inverted input "+" thereof.

This configuration makes it possible to maintain the source of the NMOS transistor Mn at a constant voltage irrespective of variation in characteristics of the transistor Mn.

SUMMARY OF THE INVENTION

In the case of the technique described in the above Patent Document 3, the variation in threshold voltage of the voltage gate transistor Mn affects the cell-applied voltage because the voltage gate transistor Mn is provided in each column of the memory cell array. As a result, the above variation leads to a reduced margin of MR ratio of the memory cell MC, thus resulting in a disadvantage, namely, a higher likelihood of read disturb.

In the case of the techniques described in the above Patent Documents 4 and 5, the variation in transistor threshold voltage which is the cause of the disadvantage with the Patent Document 3 can be canceled by a negative feedback amplifier. However, in the presence of a variation in characteristics, and particularly in threshold voltage, of a pair of transistors making up the negative feedback amplifier, the variation component affects the constant voltage level at which the source of the NMOS transistor Mn is controlled. This leads to a reduced margin of MR ratio of the memory cell MC, thus resulting in a disadvantage, namely, a higher likelihood of read disturb.

A semiconductor memory device according to the present embodiment includes a memory cell having a variable resistance element between two wirings, a sense line, and a sense amplifier circuit connected to the memory cell via the sense line.

Further, in the present embodiment, the sense amplifier circuit includes a differential sense amplifier having first and second differential inputs and whose second differential input is supplied with a reference voltage. The sense amplifier circuit further includes a pull-up section, a read gate transistor and a threshold correction section.

The pull-up section pulls up the first differential input to a constant voltage.

The read gate transistor is connected between the sense line and the first differential input. This transistor turns on if the sense line potential drops below an initial voltage level in response to a cell current.

The threshold correction section generates a voltage corrected from the initial voltage by making or breaking a diode connection of a given transistor, the impact of whose threshold voltage on the sense line potential is to be eliminated. Then, the same section applies the corrected voltage to the control terminal of the read gate transistor.

In a preferred and more specific configuration of the present embodiment, the sense amplifier circuit includes a diode connection switch circuit section and a charge/discharge switch circuit section, in addition to the differential sense amplifier and the pull-up section.

The diode connection switch circuit section includes the read gate transistor. The transistor is connected between the first differential input and the sense line. The transistor is capable of controlling the making and breaking of a diode connection by shorting the first differential input and the control terminal.

The charge/discharge switch circuit section precharges a diode connection path in a diode connection state to bring the path into a floating state. The same circuit section also discharges part of a precharge voltage to the supply line of the initial voltage according to the threshold voltage of the read gate transistor. Then, the sense amplifier circuit breaks the diode connection and senses the voltage of the first differential input with the differential sense amplifier.

In a preferred and more specific configuration of the present embodiment, the threshold correction section includes a differential amplifier having two differential transistors which make up a differential input pair. The same section further includes an initial voltage setting section adapted to set, to the initial voltage, the control terminal of one of the differential transistors of the differential amplifier. The same section still further includes a negative feedback circuit section adapted to set the other differential transistor of the differential amplifier to the initial voltage to connect to the sense line in a floating state. The same section still further includes a diode connection control section adapted to control the making and breaking of a diode connection of one of the differential transistors.

A sense amplifier circuit according to the present embodiment detects the voltage of a sense line which varies according to a current flowing through the sense line when the sense line is in a potentially floating state following the application of a given initial voltage to this line. The sense amplifier circuit includes a differential sense amplifier having first and second differential inputs and whose second differential input is supplied with a reference voltage. The sense amplifier circuit further includes a pull-up section, a read gate transistor and a threshold correction section. The pull-up section pulls up the first differential input to a constant voltage.

The read gate transistor is connected between the sense line and the first differential input. This transistor turns on if the sense line potential drops below an initial voltage level in response to a cell current.

The threshold correction section generates a voltage corrected from the initial voltage by making or breaking a diode connection of a given transistor, the impact of whose threshold voltage on the sense line potential is to be eliminated. Then, the same section applies the corrected voltage to the control terminal of the read gate transistor.

A memory cell reading method according to the present embodiment is a method of reading stored data from a memory cell via a read gate transistor. The transistor is connected between a sense line and a sense node and turns on if the sense line potential drops below an initial voltage level in response to a cell current. The memory cell reading method includes a voltage setting step and a detection step. The voltage setting step generates a voltage corrected from the initial voltage by making or breaking a diode connection of a given transistor, the impact of whose threshold voltage on the sense line potential is to be eliminated. Then, the same step applies the corrected voltage to the control terminal of the read gate transistor. Finally, the same step sets the sense line to the initial voltage to bring the line into a floating state. The detection step detects the change in the sense node potential which changes with change in a cell current by connecting the sense line, pulled up to a constant voltage, to the memory cell and comparing the change in the sense node potential with a reference voltage.

According to a preferred and more specific method of the present embodiment, the voltage setting step includes additional steps. The first step diode-connects the read gate transistor by connecting the control terminal thereof to the sense node. The second step precharges a diode connection path to bring the path into a floating state. The third step discharges part of the precharge voltage to the supply line of the initial voltage until the read gate transistor is brought into cutoff. The fourth step breaks the connection between the sense line and the supply line of the initial voltage.

In this case, the more preferred sensing step supplies a voltage, which is maintained at the sense node in a floating state, to the memory cell via the read gate transistor in cutoff, with both the connection between the sense line and the initial voltage supply line and the diode connection broken. Then, the sensing step senses the voltage maintained at the sense node which changes with change in a current flowing through the memory cell.

According to another preferred and more specific method of the present embodiment, the voltage setting step controls a control voltage of the read gate transistor through negative feedback amplification so as to bring the sense line voltage equal to the initial voltage using a differential amplifier having first and second differential transistors.

Further, the voltage setting step includes the following steps. That is, the voltage setting step includes a step of supplying a constant voltage higher than the initial voltage to the drain of the first differential transistor and the drain of the second differential transistor to which the control terminal of the read gate transistor is connected so as to maintain the drains in a floating state. The voltage setting step further includes a step of setting the control terminal of the first differential transistor to the initial voltage. The voltage setting step still further includes a step of disconnecting the control terminal of the second differential transistor from the sense line to interrupt a negative feedback loop and maintain the control terminal, disconnected from the sense line, at the initial voltage. The voltage setting step still further includes a step of diode-connecting the first differential transistor to reduce the control voltage of the first differential transistor to a voltage commensurate with the difference in threshold voltage between the first and second differential transistors so as to drive the transistor into cutoff. The voltage setting step still further includes a step of connecting the control terminal of the second differential transistor to the sense line to form the negative feedback loop.

The present embodiment allows a constant initial voltage to be applied to a sense line, independent of variation in transistor characteristics, thus providing an improved memory cell read margin.

BRIEF DESCRIPTION OF THE DRAWINGS

FIGS. 13A to 13E are waveform diagrams illustrating generation of the control signal;

FIGS. 15A to 15H are waveform diagrams illustrating low level data read operation according to the first embodiment;

FIGS. 20A to 20H are waveform diagrams illustrating high level data read operation according to the first embodiment;

FIGS. 21A to 21G are waveform diagrams illustrating low level data write operation according to the first and second embodiments;

FIG. 22 is a cell circuit diagram illustrating the direction of a cell current flow during low level data write operation;

FIGS. 23A to 23G are waveform diagrams illustrating high level data write operation according to the first and second embodiments;

FIG. 24 is a cell circuit diagram illustrating the direction of the cell current flow during high level data write operation;

DETAILED DESCRIPTION OF THE PREFERRED EMBODIMENTS

The preferred embodiments of a semiconductor memory device, sense amplifier circuit and memory cell reading method according to the present embodiment will be described below with reference to the accompanying drawings.

First Embodiment

<Overall Configuration>

Figure 7:
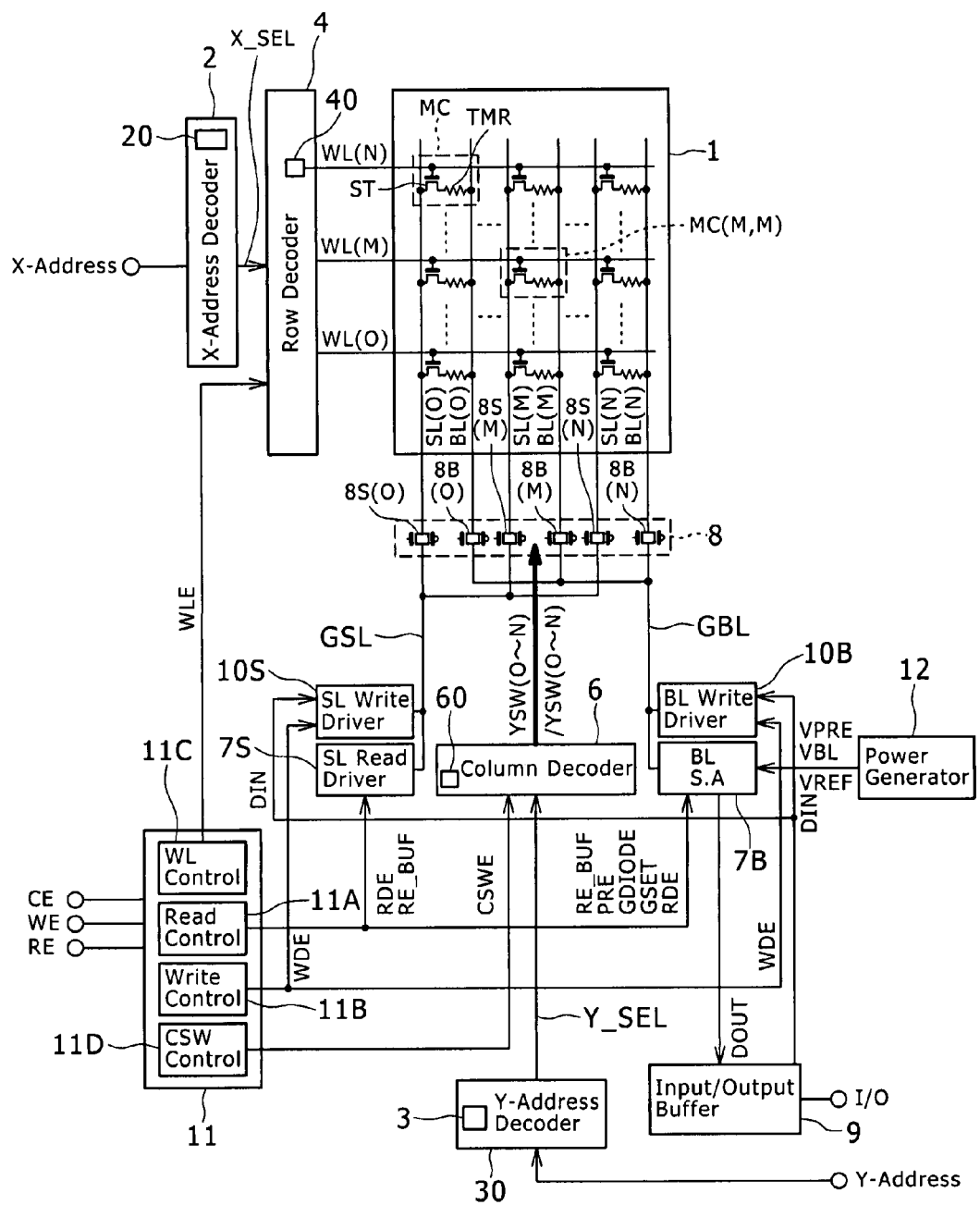
FIG. 7 is a block diagram of a semiconductor memory device according to first and second embodiments of the present invention.

FIG. 7 illustrates a block diagram of a semiconductor memory device having a (N+1)×(N+1) array configuration.

Figure 1:
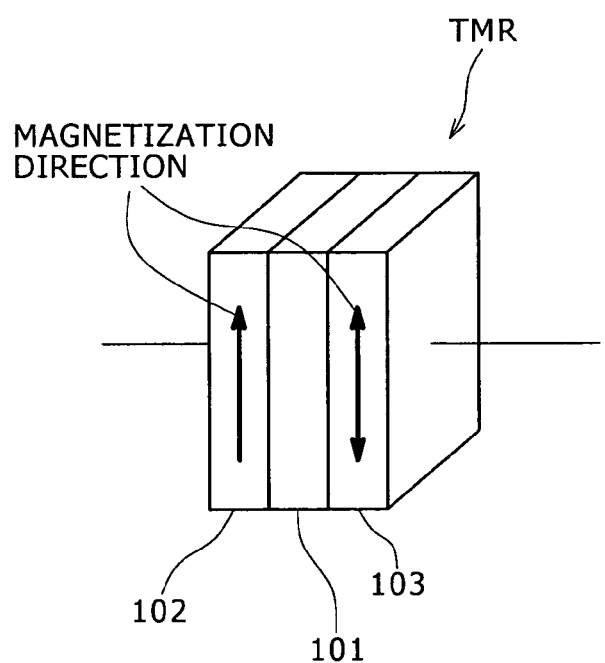
FIG. 1 is a structural view of a laminate of a tunnel magnetoresistance element.
Figure 2:
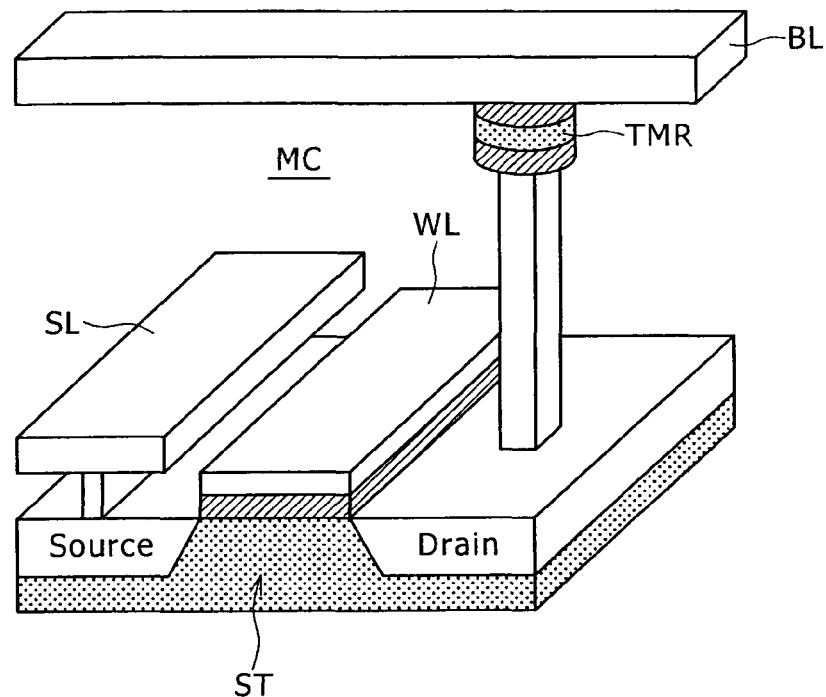
FIG. 2 is a three-dimensional view illustrating the configuration of a spin injection memory cell.
Figure 3:
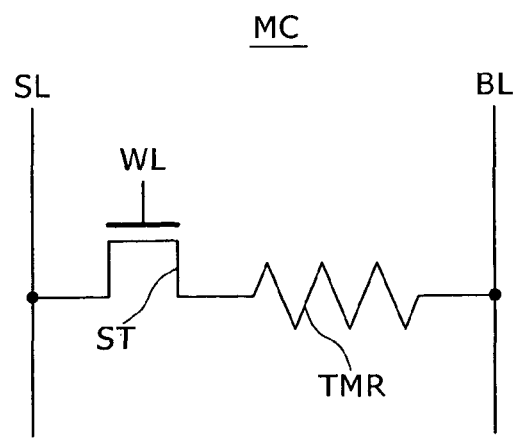
FIG. 3 is an equivalent circuit diagram of the spin injection memory cell.

The diagrammatically illustrated semiconductor memory device includes a memory cell array 1 which has (N+1) memory cells MC, illustrated in FIG. 3, arranged respectively in the row and column directions in a matrix manner. The memory device further includes peripheral circuits of the memory cells MC. It should be noted that "N" is an arbitrary positive integer and may take on a different value for each of the row and column directions.

In the memory cell array 1, (N+1) word lines WL(0) to WL(N) are disposed in the column direction at a predetermined spacing. The word lines are adapted to connect together the gates of the select transistors ST in the (N+1) memory cells MC which are aligned in the row direction. Further, (N+1) bit lines BL(0) to BL(N) are disposed in the row direction at a predetermined spacing. The bit lines are adapted to connect together the one ends of the tunnel magnetoresistance elements TMR in the (N+1) memory cells MC which are aligned in the column direction. Similarly, (N+1) source lines SL(0) to SL(N) are disposed in the row direction at a predetermined spacing. The source lines are adapted to connect together the sources of the select transistors ST in the (N+1) memory cells MC which are aligned in the column direction.

The peripheral circuits include an X address decoder (X-Address Decoder) 2, a Y address decoder (Y-Address Decoder) 3, a row decoder (Row Decoder) 4, a column decoder (Column Decoder) 6, a bit line sense amplifier (BL S.A) 7B, a source line read driver (SL Read Driver) 7S, a column select switch circuit 8, an I/O buffer (Input/Output Buffer) 9, a bit line write driver (BL Write Driver) 10B, a source line write driver (SL Write Driver) 10S, a control circuit 11 and a power generator (Power Generator) 12.

Of these components, the bit line sense amplifier 7B corresponds to an embodiment of the sense amplifier circuit according to the present embodiment.

The X address decoder 2 includes X selectors 20 as a basic unit. The X address decoder 2 decodes an input X address signal (X address) and sends an X select signal X_SEL, selected based on the decoding result, to the row decoder 4. The X selector 20 will be described in detail later.

The Y address decoder 3 includes Y selectors 30 as a basic unit. The Y address decoder 3 decodes an input Y address signal (Y address) and sends a Y select signal Y_SEL, selected based on the decoding result, to the column decoder 6. The Y selector 30 will be described in detail later.

The row decoder 4 includes (N+1) row decoder units 40, one of which is provided for each of the word lines WL. One of the word lines WL(0) to WL(N) is connected to the output of the associated row decoder unit 40. One of the row decoder units 40 is selected in accordance with the X select signal X_SEL fed from the X address decoder 2. The row decoder units 40 each apply a predetermined voltage to the word lines WL connected to their output when selected. The row decoder units 40 will be described in detail later.

The column decoder 6 includes YSW gate circuits 60 as a basic unit. The column decoder 6 generates a Y switch signal YSW and an inverted signal thereof (inverted Y switch signal YSW_) in accordance with an input Y select signal Y_SEL. The Y and inverted Y switch signal YSW and YSW_ are adapted to control the column select switch circuit 8. The YSW gate circuits 60 will be described in detail later.

The column select switch circuit 8 includes 2(N+1) transmission gates (TGs) as a basic unit. The transmission gate has NMOS and PMOS transistors with their sources connected together and drains connected together. In FIG. 7, half of the TGs are connected to the source lines. Therefore, the TGs connected to the source lines are hereinafter referred to as source line TGs 8S(0) to 8S(N). On the other hand, the remaining half of the TGs are connected to the bit lines BL. Therefore, the TGs connected to the bit lines are referred to as bit line TGs 8B(0) to 8B(N).

The terminals of the source line TGs 8S(0) to 8S(N) on the side opposite to the memory cell array are connected to a single global source line GSL. The source line TGs 8S(0) to 8S(N) control the connection between the (N+1) source lines SL(0) to SL(N) and the global source line GSL.

The source line read driver 7S and the source line write driver 10S are connected to the global source line GSL.

The terminals of the bit line TGs 8B(0) to 8B(N) on the side opposite to the memory cell array are connected to a single global bit line GBL. The bit line TGs 8B(0) to 8B(N) control the connection between the (N+1) bit lines BL(0) to BL(N) and the global bit line GBL.

The bit line sense amplifier 7B and the bit line write driver 10B are connected to the global bit line GBL.

The bit line sense amplifier 7B is the characteristic feature of the present embodiment and will be described in detail later.

The control circuit 11 has four control circuits. These control circuits receive a chip enable signal CE, a write enable signal WE and a read enable signal RE and operate based on these three enable signals. The four control circuits are a read control circuit 11A, a write control circuit 11B, a word line (WL) control circuit 11C and a column switch (CSW) control circuit 11D. The read control circuit 11A controls the source line read driver 7S and the bit line sense amplifier 7B during read operation. The write control circuit 11B controls the source line write driver 10S and the bit line write driver 10B during write operation. The WL control circuit 11C controls the row decoder 4 during data write and read operations. The CSW control circuit 11D controls the column select switch circuit 8 via the column decoder 6 during data write and read operations.

It should be noted that various control signals output from these four control circuits are designated by reference symbols only in FIG. 7 and will be described in detail later.

The power generator 12 is supplied with power and generates various types of voltages from a source voltage. In FIG. 7, only three voltages are shown as voltages output from the power generator 12. One of these voltages is a precharge voltage VPRE output to the bit line sense amplifier 7B, which is the characteristic feature of the present embodiment. The other voltages are a bit line-applied voltage VBL which serves as the "initial voltage" and a reference voltage VREF. The power generator 12 may be configured to generate and supply other types of voltages in addition to the above three voltages.

<Configuration Example of Control Circuits>

Figure 8:
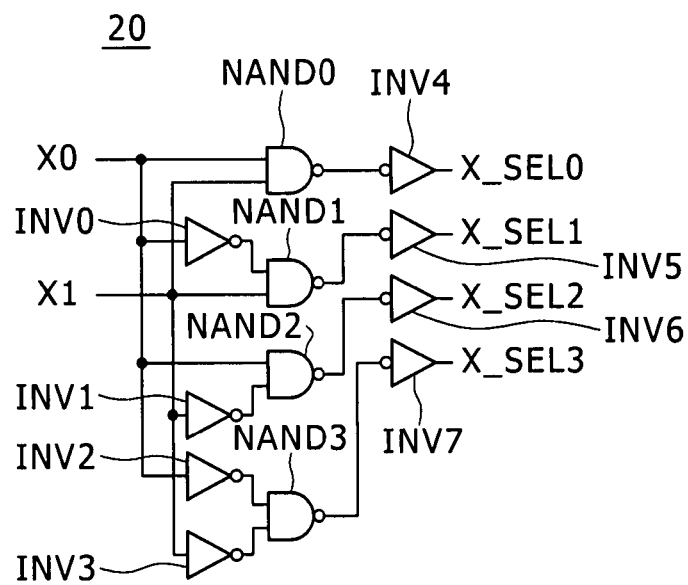
FIG. 8 is a circuit diagram of an X selector.

FIG. 8 illustrates a circuit example of the X selector 20.

The diagrammatically illustrated X selector 20 includes four inverters INV0 to INV3 in the initial stage, four NAND circuits NAND0 to NAND3 in the intermediate stage and four other inverters INV4 to INV7 connected in the final stage.

The X selector 20 receives X address bits X0 and X1 and activates (e.g., pulls up to high level) one of X select signals X_SEL0 to X_SEL3, based on the decoding result of the X address bits.

Although FIG. 8 illustrates an example of two-bit decoding, the X address decoder 2 can be implemented to handle decoding of the demanded number of bits as well as two bits according to the number of bits contained in the input X address signal by expanding or otherwise modifying the configuration of FIG. 8 to include more stages.

Figure 9:
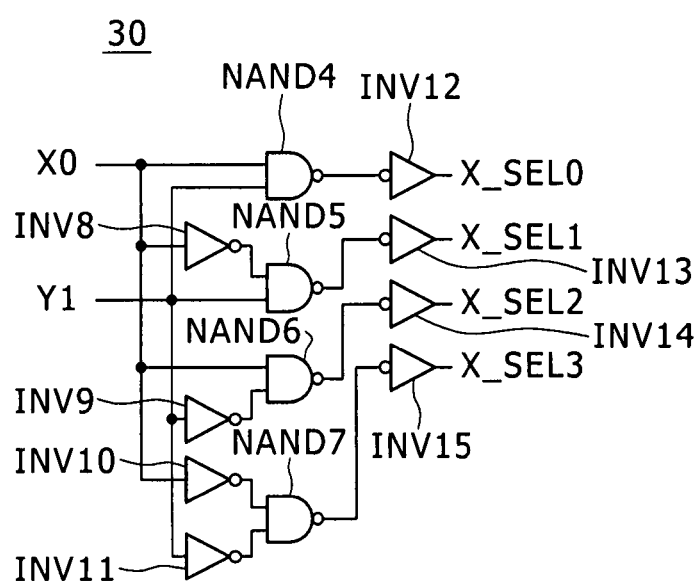
FIG. 9 is a circuit diagram of a Y selector.

FIG. 9 illustrates a circuit example of the Y selector 30.

The diagrammatically illustrated Y selector 30 includes four inverters INV8 to INV11 in the initial stage, four NAND circuits NAND4 to NAND7 in the intermediate stage and four other inverters INV12 to INV15 connected in the final stage.

The Y selector 30 receives Y address bits Y0 and Y1 and activates (e.g., pulls up to high level) one of Y select signals Y_SEL0 to Y_SEL3, based on the decoding result of the Y address bits.

Although FIG. 9 illustrates an example of two-bit decoding, the Y address decoder 3 can be implemented to handle decoding of the demanded number of bits as well as two bits according to the number of bits contained in the input Y address signal by expanding or otherwise modifying the configuration of FIG. 9 to include more stages.

Figure 10:
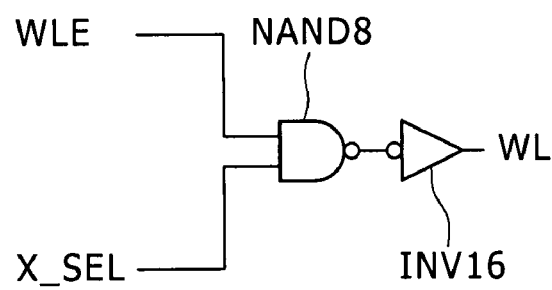
FIG. 10 is a circuit diagram of a row decoder.

FIG. 10 illustrates a circuit example of the row decoder unit 40 which is a basic component of the row decoder 4. As many of the diagrammatically illustrated row decoder units 40 are provided in the row decoder 4 as (N+1) cells in the column direction (refer to FIG. 7).

Each of the (N+1) row decoder units 40 is put into operation by the single X select signal X_SEL which has been selected (activated), for example, by the X selector 20 illustrated in FIG. 8, thus activating the single word line WL associated with the X select signal.

The row decoder unit 40 diagrammatically illustrated in FIG. 10 includes a NAND circuit NAND8 and an inverter INV16.

A write select enable signal WLE is fed to one of the inputs of the NAND circuit NAND8, and the X select signal X_SEL to the other input thereof. The output of the NAND circuit NAND8 is connected to the input of the inverter INV16. The word line WL connected to the output of the inverter INV16 is activated or inactivated.

Figure 11:
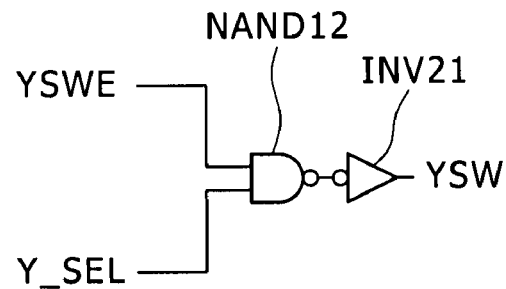
FIG. 11 is a circuit diagram of a YSW gate circuit.

FIG. 11 illustrates a circuit example of the YSW gate circuit 60.

The diagrammatically illustrated YSW gate circuit 60 includes a NAND circuit NAND12 and an inverter INV21 which is connected to the output of the NAND circuit NAND12.

A Y switch enable signal YSWE is fed to one of the inputs of the NAND circuit NAND12, and the Y select signal Y_SEL, selected (activated) by the Y selector 30 illustrated in FIG. 9, to the other input thereof. When the Y select signal and the Y switch enable signal are both active (at high level), the output of the NAND circuit NAND12 is at low level. As a result, the active level (high level) Y switch signal YSW is output from the inverter INV21 to one of the NMOS transistor gates of the bit line TGs 8B(0) to 8B(N) and the source line TGs 8S(0) to 8S(N) which make up the column select switch circuit 8 in FIG. 7. Although not illustrated in FIG. 11, the Y switch signal YSW is inverted by an inverter. The inverted Y switch signal YSW_, which is the output signal of the inverter, is output to the gate of a PMOS transistor which forms a pair with the NMOS transistor to which the Y switch signal YSW is output.

A description will be made next about an example of a sense amplifier control signal generating circuit provided in the read control circuit 11A illustrated in FIG. 7.

Figure 12:
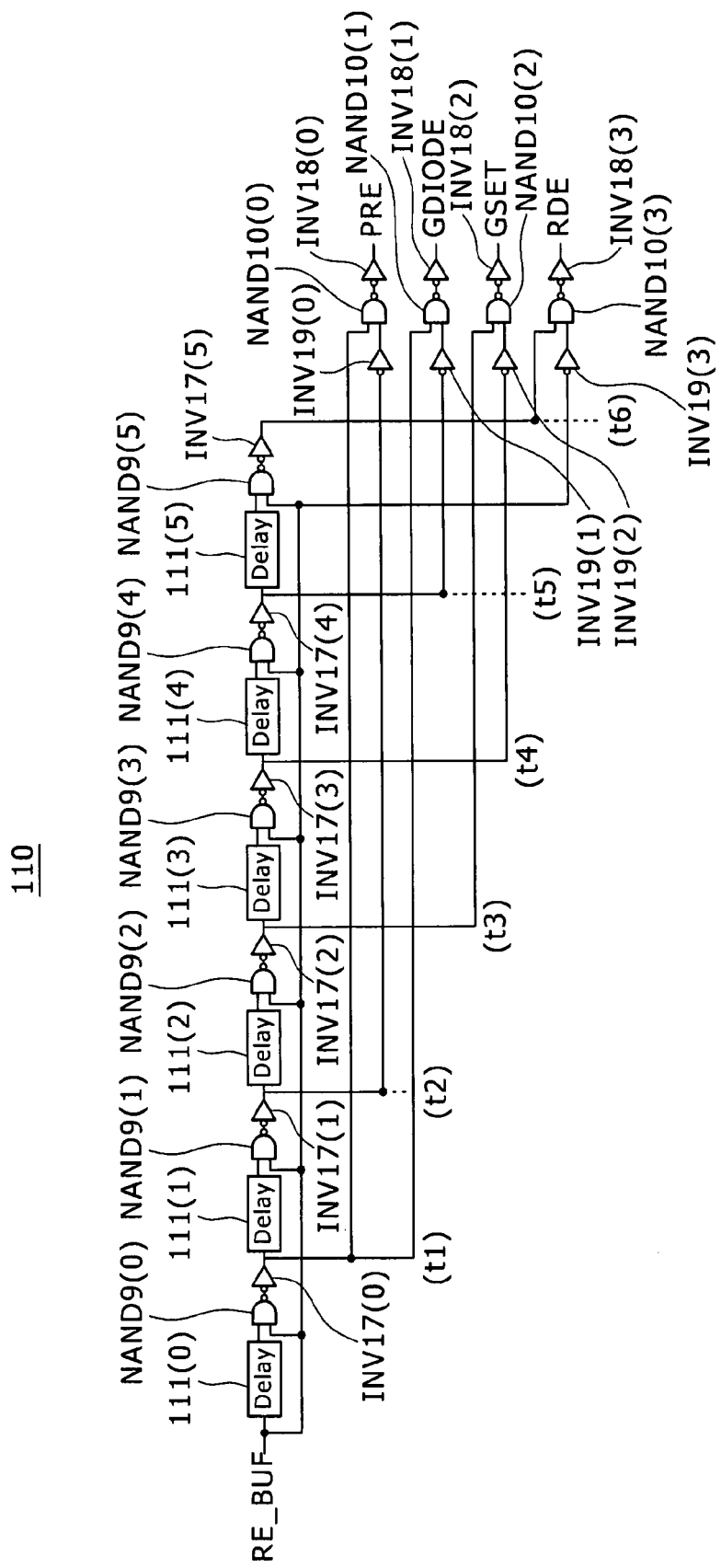
FIG. 12 is a circuit diagram of a control signal generating circuit.

This signal generating circuit is configured, for example, as illustrated in FIG. 12. FIGS. 13A to 13E illustrate operational waveforms of the circuit.

A signal generating circuit 110 diagrammatically illustrated in FIG. 12 includes six delay circuits (Delay) 111(0) to 111(5), six NAND circuits NAND9(0) to NAND9(5) and six inverters INV17(0) to INV17(5). One each of the delay circuits, NAND circuits and inverters are connected in series with each other to form a delay stage. Six delay stages are connected in series to form a delay line.

It should be noted that, in the description of FIGS. 12 and 13, a delay time in each stage is assumed to be a constant unit period T for reasons of convenience. However, the pulse length (duration) and pulse-to-pulse interval may be determined as desired in consideration of operational stability and other factors as in the case of actual data read operation which will be described later.

A read enable signal RE_BUF is generated from the read enable signal RE which is fed to the control circuit 11 illustrated in FIG. 7. As illustrated in FIG. 13A, the read enable signal RE_BUF is a pulse which has eight times as long a duration as the unit period T.

A pulse of the read enable signal RE_BUF is fed to the delay circuit 111(0) in the initial stage at time t0, thus causing the unit period T to be delayed in each stage. Delayed outputs are obtained from the delay stage taps, namely, the outputs of the inverters INV17(0) to INV17(5). In the delay operation of FIG. 12 where a rising edge of the read enable signal RE_BUF is input at time t0, the times when delayed outputs are produced from the respective taps after an elapse of the unit period T are designated by (t1) to (t6).

The NAND circuits NAND9(0) to NAND9(5) illustrated in FIG. 12 all have another input connected thereto which is different from the delayed input. This another input is connected to the input of the delay circuit 111(0). As a result, the delay operation is enabled from time t0 to t7, but interrupted at time t8, thus forcing the output of each stage to low level.

The signal generating circuit 110 has a circuit section adapted to generate control signals from the delayed outputs of the delay stage taps. This circuit section includes four input inverters INV19(0) to INV19(3), four NAND circuits NAND10(0) to NAND10(3) and four output inverters INV18(0) to INV18(3).

Of these components, the four input inverters INV19(0) to INV19(3) are provided to provide a falling edge (pulse stop) timing of the control signals to the four NAND circuits NAND10(0) to NAND10(3).

The delayed output of the first stage is fed to one of the inputs of the NAND circuit NAND10(0). The delayed output of the second stage is fed to the other input thereof via the inverter INV19(0). The output of the NAND circuit NAND10(0) is inverted by the inverter INV18(0) and output as a precharge enable signal PRE. As a result, the same signal PRE is a pulse which has a duration T and rises at time t1 and falls at time t2 as illustrated in FIG. 13C.

The delayed output of the first stage is fed to one of the inputs of the NAND circuit NAND10(1) whose output is connected to the inverter INV18(1). The delayed output of the fifth stage is fed to the other input of the NAND circuit NAND10(1) via the inverter INV19(1).

As a result, a signal GDIODE output from the inverter INV18(1) is a pulse which has a duration 4T and rises at time t1 and falls at time t5 as illustrated in FIG. 13D. A gate diode connection signal GDIODE_ (active low), which will be described later, is the inverted signal of the signal GDIODE.

The delayed output of the third stage is fed to one of the inputs of the NAND circuit NAND10(2) whose output is connected to the inverter INV18(2). The delayed output of the fourth stage is fed to the other input of the NAND circuit NAND10(2) via the inverter INV19(2).

As a result, a gate setting signal GSET output from the inverter INV18(2) is a pulse which has a duration T and rises at time t3 and falls at time t4 as illustrated in FIG. 13E.

The delayed output of the sixth (final) stage is fed to one of the inputs of the NAND circuit NAND10(3) whose output is connected to the inverter INV18(3). The other input thereof is connected to the input of the delay circuit 111(0) via the inverter INV19(3).

As a result, a read drive enable signal RDE output from the inverter INV18(3) is a pulse which has a duration 2T and rises at time t6 and is forced to terminate (falls) at time t8 as illustrated in FIG. 13E.

The four control signals generated as described above are inverted and synchronized as necessary before being fed to the drive circuits which will be described next. Hereinafter, control signals including the above four will be designated by "signal names (reference symbols)" for purposes of simplification. It should be noted that the inverted active low signals are marked with an underline "_" at the end to indicate that they are active low signals.

<Configuration of the Drive Circuits>

Figure 14A:
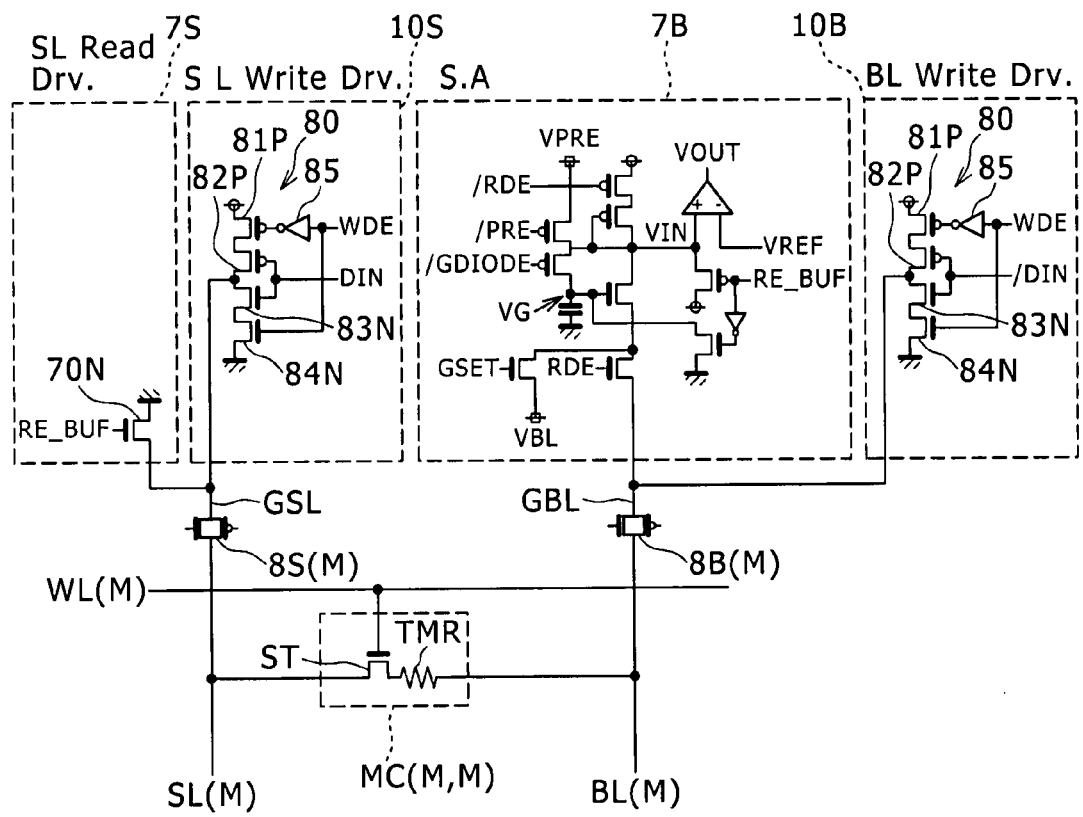
FIG. 14A is a circuit diagram of drive circuits according to the first embodiment.
Figure 14B:
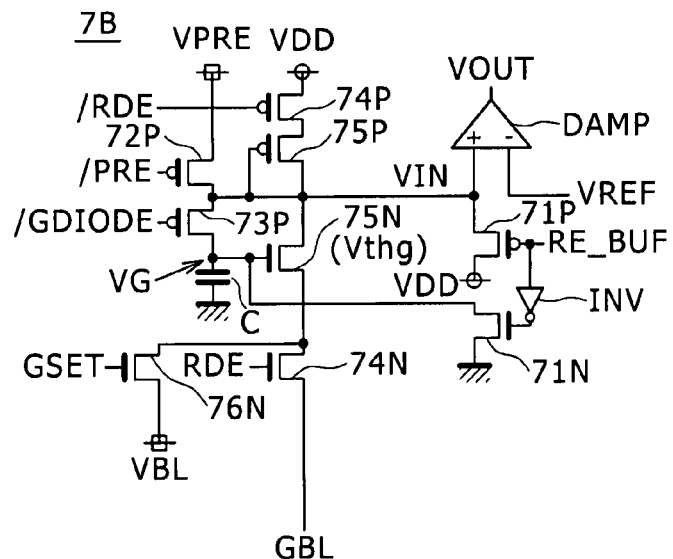
FIG. 14B is a circuit diagram of a bit line sense amplifier according to the first embodiment.

FIG. 14A illustrates examples of circuit configurations of the source line read driver 7S, the bit line sense amplifier 7B, the source line write driver 10S and the bit line write driver 10B, and the connection between these circuits and the memory cell. FIG. 14B illustrates an enlarged view of the bit line sense amplifier 7B.

A memory cell MC(M,M) illustrated in FIG. 14A has "M" as its X address and "M" as its Y address (refer to FIG. 7). The two M's shown here represent an independently selectable number equal to or greater than zero and equal to or smaller than N.

A TG 8S(M) is connected between a bit line BL(M) and the global bit line GBL. A TG 8S(M) is connected between a source line SL(M) and the global source line GSL.

The bit line write driver 10B includes a write driver 80.

The write driver 80 outputs an inverted input data voltage (/DIN), held by a write latch circuit in the I/O buffer 9, to the global bit line GBL, in response to a write drive enable signal (WDE) fed from the write control circuit 11B illustrated in FIG. 7.

The write driver 80 has two PMOS transistors 81P and 82P, two NMOS transistors 83N and 84N and an inverter 85. The PMOS transistors 81P and 82P and the NMOS transistors 83N and 84N are cascaded between a source voltage line and a reference voltage line (e.g., GND line). Of these transistors, the PMOS transistor 82P and the NMOS transistor 83N have their gates connected together so that the inverted input data voltage (/DIN) can be supplied to this common gate. The connection point between the PMOS transistor 82P and the NMOS transistor 83N is connected to the global bit line GBL. Power supply is controlled by the PMOS transistor 81P, the NMOS transistor 84N and the inverter 85 in accordance with the signal (WDE) applied to the input of the inverter 85.

The source line write driver 10S also has the write driver 80 having a similar configuration. The write driver 80 of the source line write driver 10S outputs input data DIN, held by the write latch circuit in the I/O buffer 9, to the global source line GSL, in response to the signal (WDE) fed from the write control circuit 11B illustrated in FIG. 7. In the write driver 80 of the source line write driver 10S, therefore, the input data DIN can be supplied to the common gate of the PMOS transistor 82P and the NMOS transistor 83N. The connection point between the drains of the PMOS transistor 82P and the NMOS transistor 83N is connected to the global source line GSL.

As described above, the write driver 80 of the source line write driver 10S and that of the bit line write driver 10B operate in a differential manner. When the global bit line GBL is driven to high level, the global source line GSL is driven to low level. Conversely, when the global bit line GBL is driven to low level, the global source line GSL is driven to high level.

The source line read driver 7S illustrated in FIG. 14A is put into operation in response to the signal (RE_BUF) supplied from the read control circuit 11A illustrated in FIG. 7.

On the other hand, the bit line sense amplifier 7B is put into operation as it is supplied with the following signals and voltages. That is, the same amplifier 7B is supplied with signals (RE_BUF), (/RDE), (PRE), (/GDIODE) and (GSET) from the read control circuit 11A. The same amplifier 7B is also supplied with the precharge voltage VPRE, the bit line-applied voltage VBL which serves as the "initial voltage" and the reference voltage VREF from the power generator 12.

In the source line read driver 7S, an NMOS transistor 70N is connected between the global source line GSL and the GND potential as illustrated in FIG. 14A. The signal (RE_BUF) is fed to the gate of the NMOS transistor 70N. As a result, the NMOS transistor 70N is on during read operation (refer to FIG. 13A) to set the global source line GSL to the GND potential.

The bit line sense amplifier 7B according to the present embodiment includes five PMOS transistors 71P, 72P, 73P, 74P and 75P, four NMOS transistors 71N, 74N, 75N and 76N, an inverter INV, a capacitor C and a differential sense amplifier DAMP, as illustrated in FIG. 14B.

Of these components, the NMOS transistor 75N corresponds to an embodiment of a "first (read gate) transistor" in the correspondence between the present invention and the embodiments. Further, the PMOS transistor 73P corresponds to an embodiment of a "second transistor", the PMOS transistor 72P to an embodiment of a "third transistor", and the NMOS transistor 76N to an embodiment of a "fourth transistor" in the correspondence between the present invention and the embodiments.

Still further, in the correspondence between the present invention and the embodiments, the "diode connection switch circuit section" includes the PMOS transistor 73P and the NMOS transistor 75N. The "charge/discharge switch circuit section" includes the PMOS transistor 72P and the NMOS transistors 74N and 76N. In the correspondence between the present invention and the embodiments, the PMOS transistors 74P and 75P correspond to an embodiment of the "pull-up section." Still further, the NMOS transistor 71N and the PMOS transistor 71P make up a reset circuit section.

Alternatively, the diode connection switch circuit section and the charge/discharge switch circuit section, excluding the read gate transistor (NMOS transistor 75N), are referred to together as the "threshold correction section" in an embodiment of the present invention.

One of the electrodes of the capacitor C is connected to the GND potential, and the other to the setting node of a gate potential VG. As a result, the capacitor C holds the gate potential VG relative to the GND potential.

The differential sense amplifier DAMP is an amplification circuit of the sense amplifier. The reference voltage VREF is fed to the inverted input "−", and an input voltage VIN to the non-inverted input "+" thereof.

The PMOS transistors 74P and 75P are cascaded between the supply node of the source voltage VDD and the setting node of the input voltage VIN.

The PMOS transistor 74P is controlled by the signal (/RDE). The PMOS transistor 75P has its gate and drain (the setting node of the input voltage VIN) connected together.

The NMOS transistors 75N and 74N are cascaded between the setting node of the input voltage VIN and the global bit line GBL. The gate of the NMOS transistor 75N is connected to the setting node of the gate voltage VG. The NMOS transistor 74N is controlled by the signal (RDE). Although described in detail later, the NMOS transistor 75N suppresses the variation of a cell current Icell which occurs with change in a threshold voltage Vthg.

The PMOS transistor 72P is connected between the setting node of the input voltage VIN and the supply node of the precharge voltage VPRE. Further, the PMOS transistor 73P is connected between the setting node of the input voltage VIN and that of the gate voltage VG.

The PMOS transistor 72P is controlled by the signal (PRE_), and the PMOS transistor 73P by the signal (/GDIODE).

The NMOS transistor 71N is connected between the setting node of the gate voltage VG and the GND potential. On the other hand, the PMOS transistor 71P is connected between the setting node of the input voltage VIN and the supply node of the source voltage VDD.

The PMOS transistor 71P is controlled by the signal (RE_BUF), and the NMOS transistor 71N by a signal (RE_BUF_) which is generated by inverting the signal (RE_BUF) with the inverter INV.

The NMOS transistor 76N is connected between the drain of the NMOS transistor 74N and the supply node of the bit line-applied voltage VBL. The NMOS transistor 76N is controlled by the signal (GSET).

<Low Level Data Read Operation>

FIGS. 15A to 15H illustrate waveform diagrams of a low level data read operation from the memory cell MC(M,M).

Times T0 to T8 in FIGS. 15A to 15H correspond to times t0 to t8 in FIGS. 13A to 13E. However, times T0 to T8 need not be equidistantly spaced as times t0 to t8 are. Referring to FIGS. 13A to 13E, the setting node of the input voltage VIN is precharged (VIN Pre-Charge) from time T1 to T2. Then, the same node is discharged (VIN Dis-Charge) from time T3 to T4. This discharge allows the input voltage VIN, commensurate with the threshold voltage Vthg of the NMOS transistor 75N, to be set.

The period from T1 to T5, including the charge and discharge periods of the setting node of the input voltage VIN, is referred to as a preread (Pre-Read) period.

Then, the memory cell is read by the differential sense amplifier DAMP from time T6 to T8.

In FIGS. 15A to 15H, a read cycle begins at time T0. For example, at time Ts prior thereto in the standby state, the tunnel magnetoresistance element TMR in the memory cell MC(M,M) holding low level data is in the high resistance state.

In the standby state, the signal (RE_BUF) is at low level. Therefore, the PMOS transistor 71P and the NMOS transistor 71N, illustrated in FIG. 14B, are both on. This resets the setting node of the input voltage VIN to the source voltage VDD, thus holding the setting node of the gate voltage VG at the GND potential.

The write drive enable signal WDE remains inactive (at low level) throughout the read cycle (FIG. 15F).

On the other hand, the write select enable signal WLE illustrated in FIG. 10 is active (at high level) during the read cycle. Therefore, the row decoder unit 40 activates the single word line WL (WL(M) in this example) associated with the X select signal X_SEL to high level. The other word lines are inactive (at low level).

When the signal (RE_BUF) rises to high level at time T0 (FIG. 15A), the PMOS transistor 71P and the NMOS transistor 71N, illustrated in FIG. 14B, turn off. This cancels the reset operation which holds the setting node of the input voltage VIN at the source voltage VDD and the setting node of the gate voltage VG at the GND potential, thus bringing the two setting nodes into a floating state.

Further, the NMOS transistor 70N in the source line read driver 7S, illustrated in FIG. 14A, turns on, thus setting the global source line GSL to the GND potential.

When the signals (PRE) and (GDIODE) are activated to high level at time T1 (FIGS. 15B and 15C), the PMOS transistors 72P and 73P illustrated in FIG. 14B both turn on. This diode-connects the NMOS transistor 75N, that is, connects together the drain and gate of the transistor 75N. As a result, the setting nodes of the input voltage VIN and the gate voltage VG, which are on the diode connection path, are set to the precharge voltage VPRE (FIG. 15H).

Figure 16:
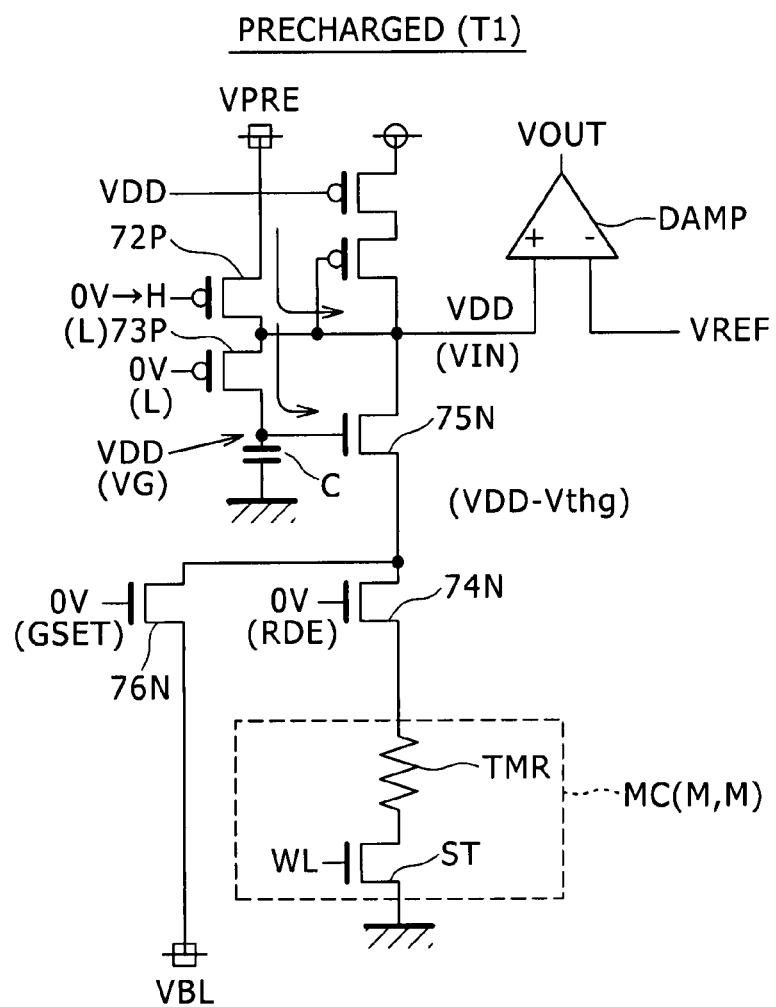
FIG. 16 is a circuit diagram of a sense amplifier in a precharged state.

Then, the signal (PRE) falls at time T2 (FIG. 15B), turning off only the PMOS transistor 72P. As a result, the diode connection path coupling together the setting nodes of the input voltage VIN and the gate voltage VG is brought into a floating state while being kept at the precharge voltage VPRE. This condition is illustrated in FIG. 16.

At this time, if the source potential of the NMOS transistor 75N is sufficiently low, it is equal to "VDD-Vthg." However, because the signals (GSET) and (RDE) remain inactive up to this time (FIGS. 15D and 15E), the source potential thereof is normally unknown.

It should be noted, however, that if the source potential of the NMOS transistor 75N is sufficiently low (or becomes sufficiently low), it is uniquely equal to "input voltage VIN (VDD at present)−Vthg." Substantially, therefore, the value of the threshold voltage Vthg is read.

Following the completion of the precharge (time T2), the potential is stable at time T3. At time T3, the signal (GSET) is raised to high level (FIG. 15D), turning on the NMOS transistor 76N. This clamps the source potential of the NMOS transistor 75N (=VIN−Vthg) to the bit line-applied voltage VBL. As a result, a voltage is applied to the source and drain of the NMOS transistor 75N, turning on the NMOS transistor 75N. For the NMOS transistor 75N to turn on, the precharge voltage VPRE must be higher than the bit line-applied voltage VBL by the threshold voltage Vthg of the NMOS transistor 75N or more.

Figure 17:
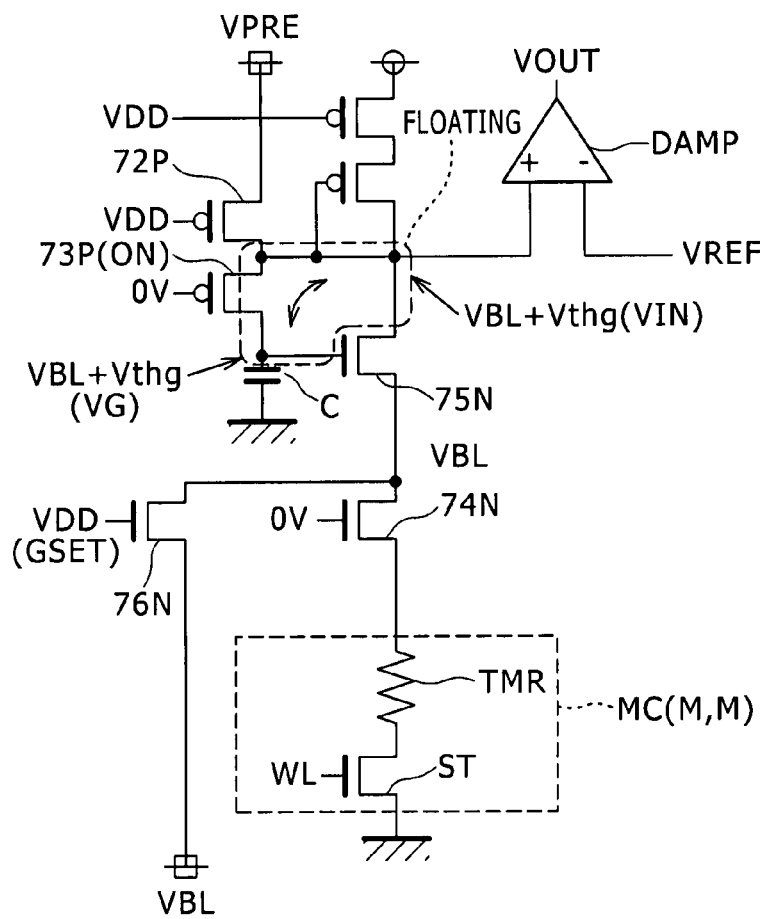
FIG. 17 is a circuit diagram of the sense amplifier in a discharged state.

The condition after the discharge is illustrated in FIG. 17.

When the NMOS transistor 75N turns on, the setting node of the input voltage VIN held at the source voltage VDD is discharged via the NMOS transistors 75N and 76N which are on.

This causes the setting node of the input voltage VIN to drop in potential as illustrated in FIG. 15H. At this time, the PMOS transistor 73P is on, and the NMOS transistor 75N is diode-connected. As a result, the input voltage VIN and the gate voltage VG drop to (VBL+Vthg). This brings the NMOS transistor 75N into cutoff, holding the voltages VIN and VG constant at that potential (FIG. 15H). FIG. 17 illustrates the condition following this cutoff.

It should be noted that although an NMOS transistor is used for the NMOS transistor 76N in FIG. 17 for reasons of simplification, a PMOS transistor or transfer gate may need to be used depending on the potential.

As a result of the discharge, the input voltage VIN is set equal to the bit line-applied voltage VBL plus an offset of the threshold voltage Vthg of the NMOS transistor 75N.

All the NMOS transistors in the bit line sense amplifier 7B illustrated in FIG. 14B, including the NMOS transistor 75N, are formed by the same process at positions extremely close to each other on the device. As a result, the transistor characteristics change together. Further, the characteristics of the NMOS transistors such as those of the select transistor ST also change together.

Therefore, the threshold voltages of the NMOS transistors in the semiconductor memory device change together their orientation and magnitude (ratio). Therefore, it is only necessary to use one of the above threshold voltages as the threshold voltage Vthg adapted to provide an offset. In the present embodiment, the threshold voltage is reflected not in the discharge path, but in the transistor which is diode-connected during the discharge, namely, the NMOS transistor 75N.

Incidentally, although FIG. 7 shows only the single bit line sense amplifier 7B, data is normally not read one bit at a time but several bits to one word at a time. For example, if eight bits of data are read simultaneously, the memory cell array 1 is divided into eight column blocks. The global bit line GBL and the bit line sense amplifier 7B are provided for each of these blocks.

In such a case, the threshold voltage Vthg of the NMOS transistor 75N, illustrated in FIG. 17, has a unique value in the plurality (e.g., eight to several tens) of different bit line sense amplifiers 7B.

In the present embodiment, the input voltage VIN is set for each of the bit line sense amplifiers 7B according to the threshold voltage Vthg which changes from one bit line sense amplifier 7B to another. That is, the input voltage VIN is set with reference to the threshold voltage Vthg of the own circuit in a self-referenced manner.

Next, when viewed from the memory cell MC, the input voltage VIN is equal to the value obtained by subtracting the threshold voltage Vthg from the input voltage VIN during the sensing. However, the input voltage VIN is set to (VBL+Vthg) in a self-referenced manner in each of the bit line sense amplifiers 7B. During sensing of the plurality of bit line sense amplifiers 7B, therefore, the constant bit line-applied voltage VBL is typically applied to the memory cell to be read. That is, the bit line sense amplifiers 7B of the present embodiment can supply a constant bit line voltage which remains immune to fluctuations resulting from a process change or other causes.

Referring back to FIGS. 15A to 15H, when the signal (GSET) falls at time T4, the NMOS transistor 76N turns off, shutting off the discharge path. When the signal (GDIODE) falls at time T5, the PMOS transistor 73P turns off, breaking the diode connection. This terminates the preread operation.

Figure 18:
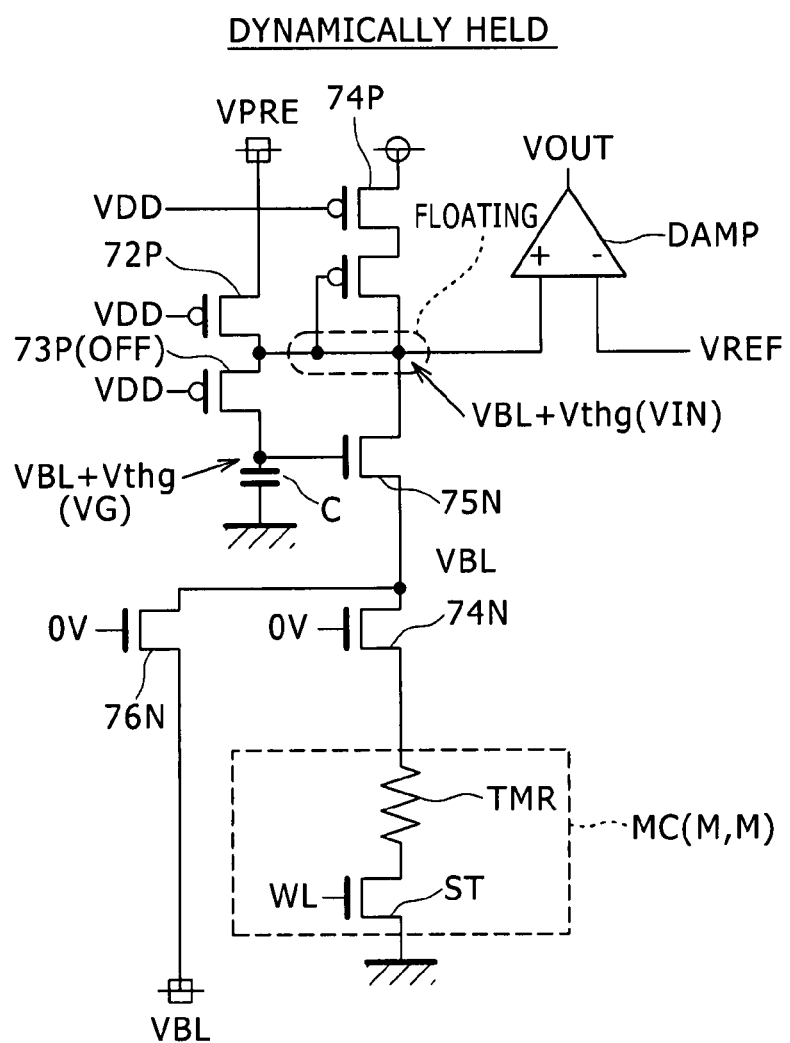
FIG. 18 is a circuit diagram of the sense amplifier in a dynamically held state.

FIG. 18 illustrates the condition following the preread operation.

The PMOS transistors 72P, 73P and 74P connected to the setting node of the input voltage VIN all turn off. In addition, the NMOS transistors 74N and 76N, connected to setting node of the input voltage VIN via the NMOS transistor 75N in cutoff are also off. As a result, the setting node of the input voltage VIN is brought into a floating state. The potential is held in a relatively large parasitic capacitance of these transistors. At this time, the relationship VPRE>NIN>VBL holds. Therefore, if the input voltage VIN attempts to vary considerably due to noise, the charge compensation functions are activated, including charge injection from the PMOS transistor 72P and draining of excess charge to the NMOS transistor 76N, thus allowing for potential compensation. That is, the input voltage VIN is dynamically held at a constant level by suppressing its fluctuation due to noise.

Figure 19:
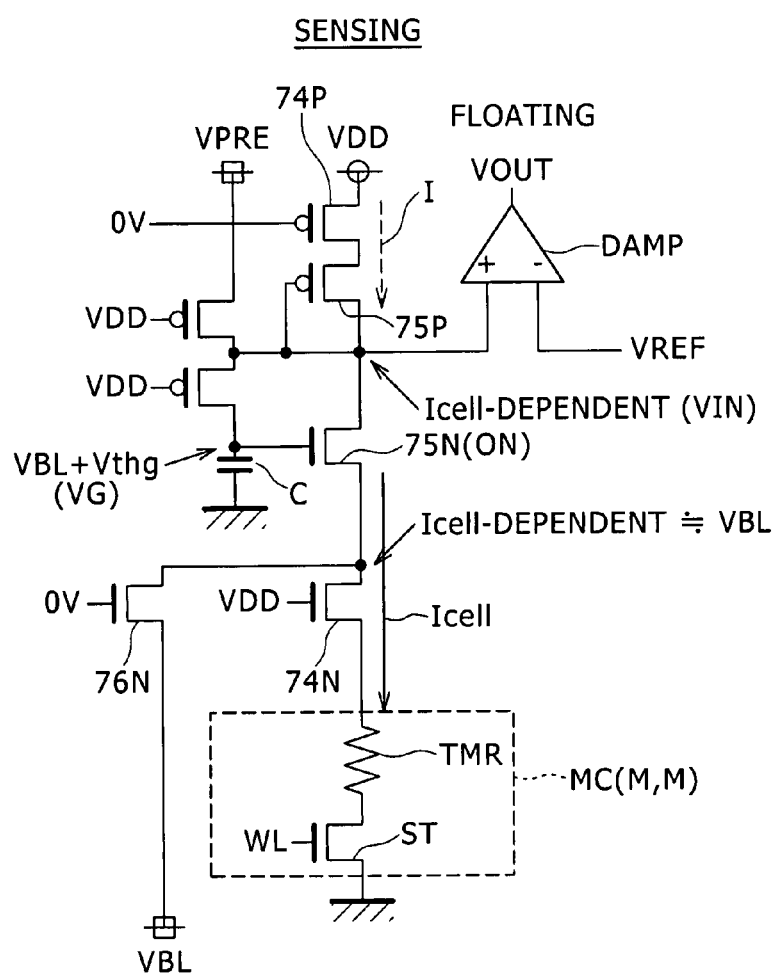
FIG. 19 is a circuit diagram of the sense amplifier in a sensing start state.

Next, when the signal (RDE) rises at time T6 as illustrated in FIG. 15E, the sensing starts. FIG. 19 illustrates the condition during the sensing period.

The PMOS transistor 74P and the NMOS transistor 74N illustrated in FIG. 19 both turn on. This forms a flow path of the cell current Icell of the memory cell MC(M,M). As a result, the cell current Icell, commensurate with the resistance of the tunnel magnetoresistance element TMR, flows from the supply source, namely, the input voltage VIN. The cell current Icell flows to the memory cell MC(M,M) through the NMS transistors 75N and 74N which are both on.

The drop of the input voltage VIN is compensated for by the following arrangement. That is, the PMOS transistor 74P turns on. Then, a current I is supplied to the input voltage VIN through the PMOS transistor 74P and the diode-connected PMOS transistor 75P.

At this time, strictly speaking, even in the presence of a variation in size of the NMOS transistor 75N, namely, for example, gate length or gate width thereof, or in the presence of a change in the cell current Icell, the source potential of the NMOS transistor 75N is maintained almost at the bit line-applied voltage VBL because the gate voltage VG is held at (VBL+Vthg) by the capacitor C.

At this time, the drain potential (input voltage VIN) of the NMOS transistor 75N varies relative to the source potential thereof according to the magnitude of the cell current Icell. The setting node of the input voltage VIN is adapted to convert the cell current Icell into voltage. The potential thereof is dependent upon the cell current.

In the present embodiment, the tunnel magnetoresistance element TMR is in the high resistance state during low level data read operation. Therefore, the cell current Icell is relatively small. As illustrated in FIG. 15H, the input voltage VIN is pulled up via the PMOS transistors 74P and 75P. As a result, the input voltage VIN rises higher than the reference voltage VREF and converges there.

To ensure that the bit line-applied voltage applied to the memory cell MC(M,M) is equal to VBL, the NMOS transistor 74N is preferably relatively large in size, and the on-resistance thereof is preferably negligibly small.

On the other hand, the differential sense amplifier DAMP receives, as differential inputs, the input voltage VIN which is dependent upon the cell current Icell and the reference voltage VREF. The same amplifier DAMP amplifies the difference between the two differential inputs to generate an output VOUT. The reference voltage VREF is generated by the power generator 12 illustrated in FIG. 12 and fed to the inverted input "−" of the differential sense amplifier DAMP. The reference voltage VREF is generated to be equal to the value of the input voltage VIN when the cell current flows through the tunnel magnetoresistance element TMR in the intermediate resistance state between the high and low resistance states.

As illustrated in FIGS. 15A and 15E, the read operation terminates when the signals (RE_BUF) and (RDE) fall.

The output VOUT of the differential sense amplifier DAMP is placed onto a bus (I/O bus) via the I/O buffer 9 illustrated in FIG. 7 as read output data DOUT.

<High Level Data Read Operation>

FIGS. 20A to 20H illustrate waveform diagrams of a high level data read operation. It should be noted that the operation control of the bit line sense amplifier 7B is the same as during the low level data read operation. Therefore, the description thereof will be omitted.

At this time, the tunnel magnetoresistance element TMR is in the low resistance state. As a result, the cell current Icell is relatively large. Therefore, the pulldown capability produced by the cell current Icell is greater than a given pullup capability. This allows the input voltage VIN to converge at a level lower than the reference voltage VREF, as illustrated in FIG. 20H.

The output VOUT (high level) of the differential sense amplifier DAMP is placed onto the bus (I/O bus) via the I/O buffer 9 illustrated in FIG. 7 as the read output data DOUT.

<Data Write Operation>

The data write operation will be described below with reference to FIG. 14A and FIGS. 21 to 24.

FIGS. 21A to 21G are waveform diagrams of a low level data write operation. FIG. 22 is a cell circuit diagram illustrating the flow direction of the cell current Icell during the low level data write operation.

In the low level data write operation, the tunnel magnetoresistance element TMR is switched from the low to high resistance state.

As illustrated in FIGS. 21A to 21E, the read control signals, namely, the signals (RE_BUF), (PRE), (GDIODE) and (RDE), remain inactive throughout the write operation. On the other hand, the word line WL is active.

First, after the input data DIN (write data) (/DIN) is finalized (time T1), a pulse of the signal (WDE) is applied (FIG. 21F). This supplies the input data DIN from the source line write driver 10S illustrated in FIG. 14A to the source line SL. This also supplies the inverted input data voltage (/DIN) from the bit line write driver 10B illustrated in FIG. 14A to the bit line BL. For low level data, the input data DIN is at the source voltage VDD level, and the inverted input data voltage (/DIN) is at the GND level. Therefore, the relationship in potential between the source line SL and the bit line BL is as illustrated in FIG. 22.

Figure 4:
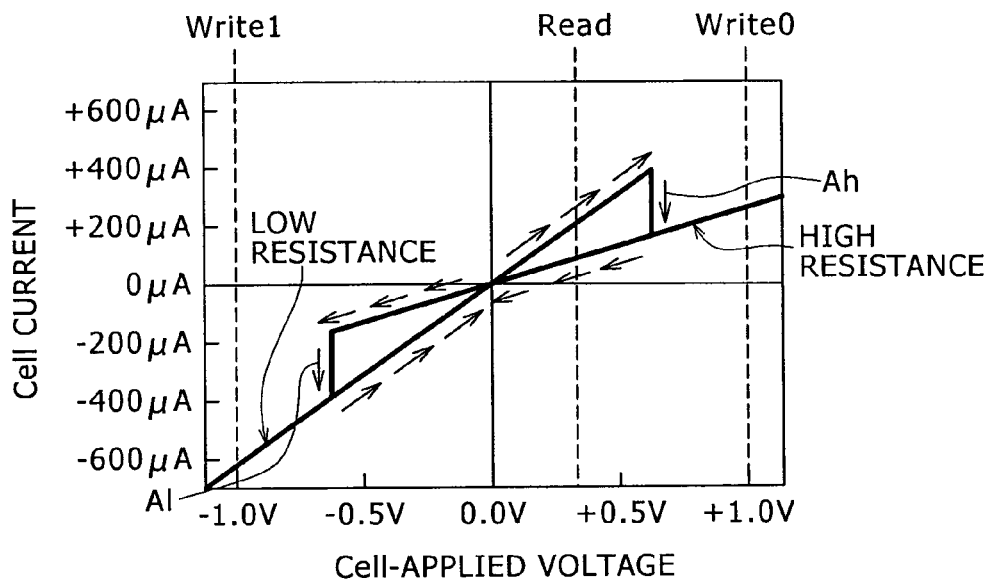
FIG. 4 is a hysteresis characteristic diagram of the tunnel magnetoresistance element.
Figure 5:
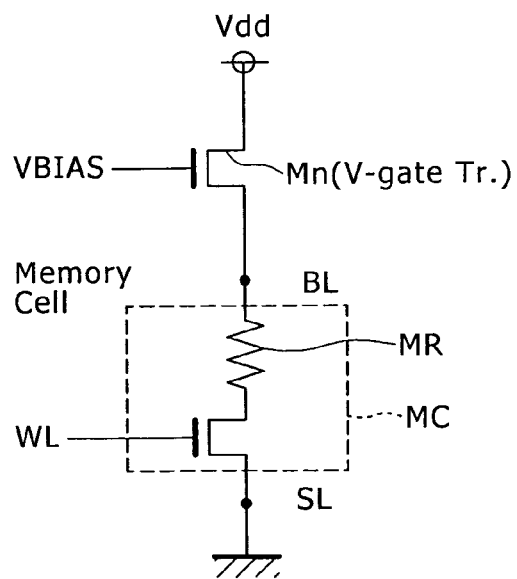
FIG. 5 is a circuit diagram of a memory column illustrating an example of the background technology.
Figure 6:
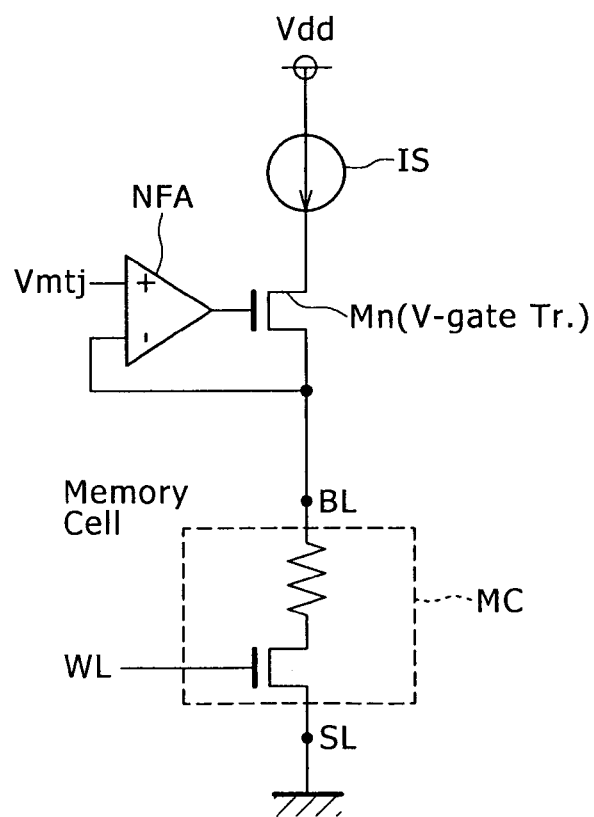
FIG. 6 is a circuit diagram for applying a bit line voltage which illustrates another example of the background technology.

At this time, a write potential difference develops across the tunnel magnetoresistance element TMR. As a result, the same element TMR transitions to the high resistance state (arrow Ah) as illustrated in FIG. 4.

Then, the signal (WDE) falls at time T3 (FIG. 21F) to inactivate the word line WL, thus terminating the write operation.

FIGS. 23A to 23G are waveform diagrams of a high level data write operation. FIG. 24 is a cell circuit diagram illustrating the flow direction of the cell current Icell during the high level data write operation.

In the high level data write operation, the tunnel magnetoresistance element TMR is switched from the high to low resistance state.

As illustrated in FIGS. 23A to 23E, the read control signals remain inactive throughout the write operation as with FIGS. 21A to 21E. On the other hand, the word line WL is active.

First, after the input data DIN (write data) (/DIN) is finalized (time T1), a pulse of the signal (WDE) is applied (FIG. 23F). This supplies the input data DIN from the source line write driver 10S illustrated in FIG. 14A to the source line SL. This also supplies the inverted input data voltage (/DIN) from the bit line write driver 10B illustrated in FIG. 14A to the bit line BL. For high level data, the input data DIN is at the GND level, and the inverted input data voltage (/DIN) is at the source voltage VDD level. Therefore, the relationship in potential between the source line SL and the bit line BL is as illustrated in FIG. 24.

At this time, a write potential difference develops across the tunnel magnetoresistance element TMR. As a result, the same element TMR transitions to the low resistance state (arrow Al) as illustrated in FIG. 4.

Then, the signal (WDE) falls at time T3 to inactivate the word line WL, thus terminating the write operation.

In the first embodiment described above, the bit line sense amplifier 7B represents an example of the "sense amplifier circuit" of the present invention.

The sense amplifier circuit of the present invention is characterized in that it has a threshold correction section in addition to the differential sense amplifier DAMP and the pull-up section (e.g., PMOS transistors 74P and 75P). The threshold correction section generates a voltage corrected from the initial voltage (e.g., bit line voltage VBL) by making or breaking a diode connection of a given transistor (e.g., NMOS transistor 75N in the first embodiment), the impact of whose threshold voltage on the sense line potential (e.g., wiring connected to the source of the NMOS transistor 75N) is to be eliminated. Then, the same section applies the corrected voltage ("VBL+Vthg" in the first embodiment) to the control terminal of the read gate transistor (NMOS transistor 75N).

A description will be made below about a second embodiment in which the conceptually broad threshold correction section is implemented with other circuitry.

Second Embodiment

Figure 25:
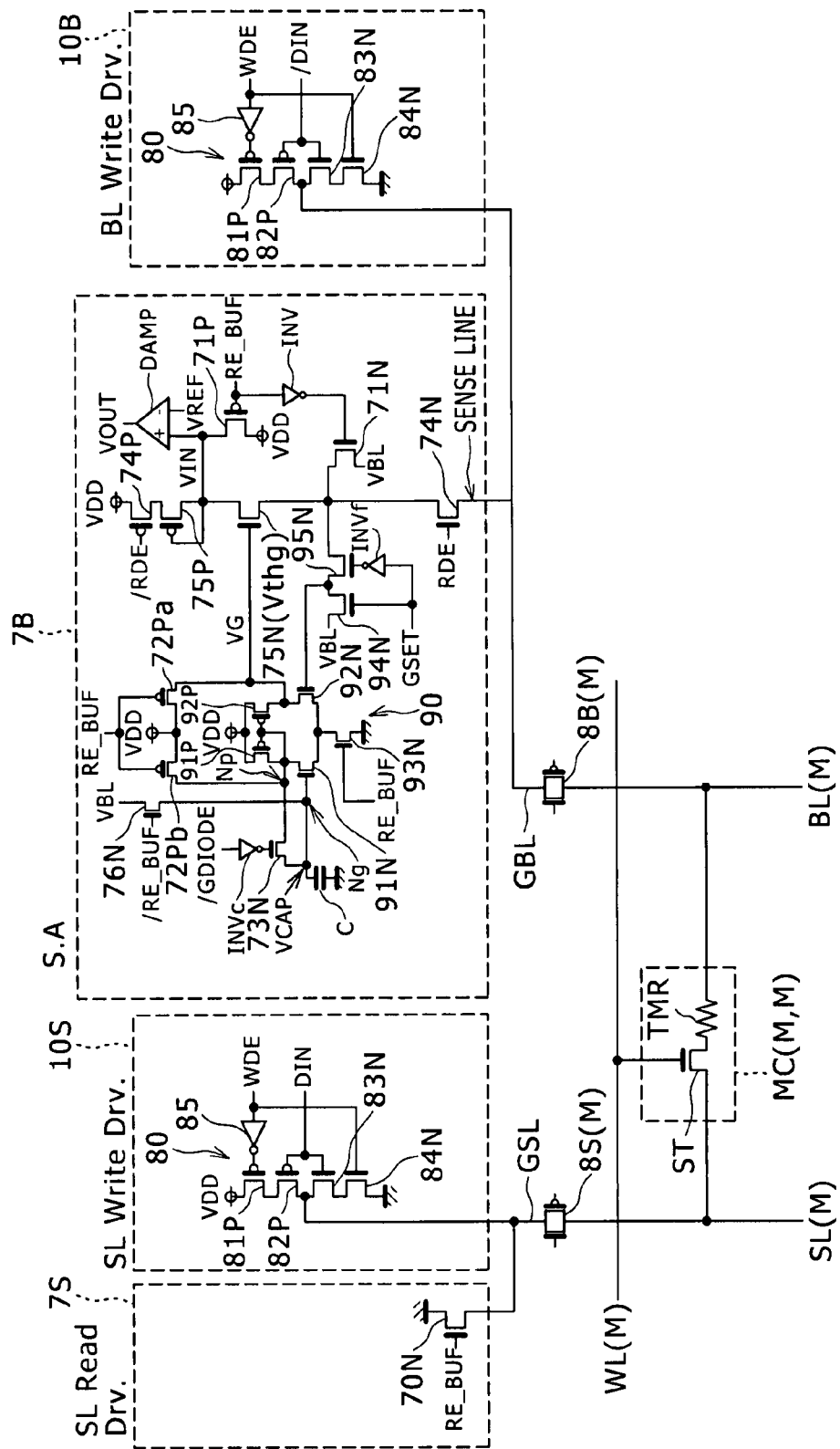
FIG. 25 is a circuit diagram of drive circuits according to the second embodiment.

FIG. 25 illustrates examples of circuit configurations of the source line read driver 7S, the bit line sense amplifier 7B, the source line write driver 10S and the bit line write driver 10B, and the connection between these circuits and the memory cell.

Here, the source line read driver 7S, the source line write driver 10S and the bit line write driver 10B are configured in the same manner as in the first embodiment. Therefore, these components are designated by the same reference symbols, and the description thereof will be omitted. Further, FIG. 7 to FIGS. 13A to 13E used for the first embodiment and FIGS. 21A to 21G to FIG. 24 used for the data write operation also apply to the present second embodiment. The description of these figures is the same as in the first embodiment. Therefore, the description thereof will be omitted.

<Configuration of the Sense Amplifier Circuit>

In the bit line sense amplifier 7B diagrammatically illustrated in FIG. 25, the differential sense amplifier DAMP, the PMOS transistor 71P, the NMOS transistor 75N (read gate transistor) and the PMOS transistors 74P and 75P are connected to the setting node of the input voltage VIN, as in the first embodiment (FIG. 14A). These transistors play the same roles as in the first embodiment.

Further, the NMOS transistor 74N is connected between the sense line, connected to the source of the NMOS transistor 75N, and the global bit line GBL, as in the first embodiment. The NMOS transistor 74N also plays the same role as in the first embodiment.

The bit line sense amplifier 7B has the NMOS transistor 71N as in the first embodiment. The NMOS transistor 71N is controlled by the signal (RE_BUF_) which is generated by inverting the read enable signal RE_BUF with the inverter INV. It should be noted, however, that the NMOS transistor 71N in the present embodiment differs from that in the first embodiment in that the source thereof is connected to the sense line (source of the NMOS transistor 75N), and that the drain thereof is connected to the supply line of the bit line voltage VBL which serves as the "initial voltage."

The "threshold correction section" of the bit line sense amplifier 7B according to the present embodiment has a negative feedback differential amplifier.

The negative feedback differential amplifier includes an amplifier section 90 and an "initial voltage setting section" made up of the NMOS transistors 71N and 76N. The negative feedback differential amplifier further includes a "negative feedback circuit section" made up of NMOS transistors 94N and 95N and an inverter INVf. The negative feedback differential amplifier still further includes a "diode connection section" made up of an NMOS transistor 73N, an inverter INVc and the capacitor C, and a "precharge section" made up of PMOS transistors 72Pa and 72Pb.

The amplifier section 90 has a pair of first and second differential transistors 91N and 92N. The sources of the first and second differential transistors 91N and 92N are connected together. These sources are connected to the GND potential via an NMOS transistor 93N. A PMOS transistor 91P is connected between the drain of the first differential transistor 91N and the source voltage VDD. A PMOS transistor 92P is connected between the drain of the second differential transistor 92N and the source voltage VDD. The gates of the PMOS transistors 91P and 92P are connected together. These gates are connected to the connection node (hereinafter referred to as a precharge node Np) between the first differential transistor 91N and the PMOS transistor 92P. The connection node between the second differential transistor 92N and the PMOS transistor 92P, which is the output of the amplifier section 90, is connected to the gate of the NMOS transistor 75N (read gate transistor).

The NMOS transistors 94N and 95N making up the "negative feedback circuit section" are cascaded between the supply line of the bit line voltage VBL which serves as the "initial voltage" and the sense line. The connection point between the two transistors is connected to the gate of the second differential transistor 92N.

A negative feedback loop is formed when the NMOS transistors 94N and 95N are both on, and is interrupted when the two transistors are off. The NMOS transistor 94N is controlled by the signal which is generated by inverting the signal (GSET) with the inverter INVf.

The NMOS transistor 73N making up the "diode connection section" is connected between the precharge node Np and a gate node Ng of the first differential transistor 91N. The capacitor C is connected between the gate node Ng and the GND potential. The NMOS transistor 73N is controlled by the signal which is generated by inverting the signal (/GDIODE) with the inverter INVc.

The NMOS transistor 76N making up the "initial voltage setting section" is connected between the supply line of the bit line voltage VBL which serves as the "initial voltage" and the gate node Ng. The NMOS transistor 76N is controlled by the signal (/RE_BUF) which is generated by inverting the read enable signal RE_BUF.

The PMOS transistor 72Pa making up the "precharge section" is connected between the source voltage VDD and the precharge node Np. The PMOS transistor 72Pb also making up the "precharge section" is connected between the source voltage VDD and the output. The PMOS transistors 72Pa and 72Pb are both controlled by the read enable signal RE_BUF.

<Data Read Operation>

FIGS. 26A to 26E illustrate signal waveform diagrams of low or high level data read operation from the memory cell MC(M,M).

The control signal pulse waveforms and application timings are illustrated in FIGS. 26A to 26D. The signal (RDE) has the same pulse width and timing as in the first embodiment in relation to the signal (RE_BUF) which defines the read period. However, the signals (GSET) and (GDIODE) have different pulse widths and timings from those in the first embodiment (refer to FIG. 13). These changes, however, can be readily made by modifying the signal generating circuit 110 illustrated in FIG. 12 as follows. That is, the modification composes of changing the number of stages of the delay circuit where a leader line is connected so that the waveforms illustrated in FIGS. 26C and 26D can be obtained. The leader line defines the rising and falling timings of the pulse.

In FIGS. 26A to 26E, a read cycle begins at time T0. For example, at time Ts prior thereto in the standby state, the tunnel magnetoresistance element TMR in the memory cell MC(M,M) holding low level data is in the high resistance state. On the other hand, the same element TMR in the memory cell MC(M,M) holding high level data is in the low resistance state.

In the standby state, the signal (RE_BUF) is at low level. As a result, the NMOS transistors 71N and 76N are both on. The initial voltage (bit line voltage VBL) is applied to the sense line and the gate node Ng. At this time, the signal (GSET) is at low level. Therefore, the NMOS transistor 95N is on, thus forming a negative feedback loop. Hence, the differential input pair of the amplifier section 90 is reset by the initial voltage. The initial voltage applied to the gate node Ng is held by the capacitor C.

Further, the PMOS transistor 71P is on. As a result, the setting node of the input voltage VIN is reset to the source voltage VDD. Still further, the PMOS transistors 72Pa and 72Pb are both on. As a result, the precharge node Np on the input side of the amplifier section 90 and the output (gate of the NMOS transistor 75N) are precharged to the source voltage VDD.

Although not specifically illustrated, the write drive enable signal WDE remains inactive (at low level) throughout the read cycle as in the first embodiment. On the other hand, the write select enable signal WLE illustrated in FIG. 10 is active (at high level) during the read cycle. Therefore, the row decoder unit 40 activates the single word line WL (WL(M) in this example) associated with the X select signal X_SEL to high level. The other word lines are inactive (at low level).

When the signal (RE_BUF) rises to high level at time T0 (FIG. 26A), the NMOS transistor 71N and the PMOS transistor 71P, illustrated in FIG. 25, turn off. This cancels the reset operation which holds the setting node of the input voltage VIN. As a result, the setting node is brought into a floating state while kept at the source voltage VDD.

Further, the reset operation of the differential input pair of the amplifier section 90 by the initial voltage is canceled. As a result, the differential input pair (gate of the first and second differential transistors 91N and 92N) is brought into a floating state while kept at the initial voltage (bit line voltage VBL). It should be noted that, at this time, the negative feedback loop remains formed. Therefore, the differential input pair is brought into a floating state, with the bit line voltage VBL set between the negative feedback loop and the sense line.

Further, the PMOS transistors 72Pa and 72Pb turn off at time T0, canceling the precharge operation.

Still further, the NMOS transistor 70N in the source line read driver 7S, illustrated in FIG. 25, turns on, setting the global source line GSL to the GND potential.

The signals (GSET) and (GDIODE) are activated to high level at time T1 (FIGS. 26C and 26D).

When the signal (GSET) rises to high level, the NMOS transistor 95N illustrated in FIG. 25 turns off, interrupting the negative feedback loop. At the same time, the NMOS transistor 94N turns on, connecting the gate of the second differential transistor 92N to the supply line of the bit line voltage VBL and clamping the potential.

When the signal (GDIODE) rises to high level, the NMOS transistor 73N turns on, diode-connecting the first differential transistor 91N.

If the source voltage VDD precharged to the drain of the first differential transistor 91N prior to the diode connection is sufficiently higher than the initial voltage (bit line voltage VBL) to which the gate is set, the first differential transistor 91N turns on for a short period of time and then is automatically brought into cutoff due to the diode connection. This short discharge takes place due to the current mirror operation and continues until the difference in gate voltage between the first and second differential transistors 91N and 92N is zero. It should be noted, however, that the difference in gate voltage therebetween is zero in an ideal case where the difference in threshold voltage therebetween is zero. In reality, a voltage often develops at the gate of the first differential transistor 91N which is equal to the gate voltage (bit line voltage VBL) of the second differential transistor 92N plus an offset. This offset is a threshold voltage difference ΔVth. Here, the term "threshold voltage difference ΔVth" refers to an extremely small voltage having a positive or negative polarity.

If the voltage held by the capacitor C after the diode connection is defined as a "capacitor precharge voltage VCAP", the same voltage VCAP increases or decreases from time T1 to converge to a predetermined level as illustrated in FIG. 26E. When the capacitor precharge voltage VCAP stabilizes after the first differential transistor 91N is brought into cutoff, the signal (GDIODE) falls at time T4.

In FIG. 26E, the period from time T1 to T4 is shown as "VCAP Precharge."

Then, when the signal (GSET) falls at time T5, the NMOS transistor 94N illustrated in FIG. 25 turns off, interrupting the supply of the bit line voltage VBL. At the same time, the NMOS transistor 95N illustrated in FIG. 25 turns on, forming a negative feedback loop again. Thereafter, the amplifier section 90 feeds back the sense line potential applied to the second differential transistor 92N relative to the voltage "VBL+ΔVth" held by the gate of the first differential transistor 91N, dynamically controlling the gate voltage of the NMOS transistor 75N. This allows for accurate control of the sense line potential at the bit line voltage VBL even in the presence of a threshold voltage difference between the two transistors making up the differential input pair of the amplifier section 90. This bias setting of the read gate transistor through threshold voltage correction is referred to as "preread." As a result, the data read operation is ready for execution by time T5.

Then, when the signal (RDE) rises at time T6, the sensing starts (FIG. 26B) as in the first embodiment.

The PMOS transistor 74P and the NMOS transistor 74N illustrated in FIG. 25 both turn on. This forms a flow path of the cell current Icell of the memory cell MC(M,M). As a result, the cell current Icell, commensurate with the resistance of the tunnel magnetoresistance element TMR, flows from the supply source, namely, the input voltage VIN. The cell current Icell flows to the memory cell MC(M,M) through the NMS transistors 75N and 74N which are both on.

The drop of the input voltage VIN is compensated for by the following arrangement. That is, the PMOS transistor 74P turns on. Then, the current I is supplied to the input voltage VIN through the PMOS transistor 74P and the diode-connected PMOS transistor 75P.

At this time, even in the presence of a variation in size of the NMOS transistor 75N, namely, for example, gate length or gate width thereof, or in the presence of a change in the cell current Icell, the source potential of the NMOS transistor 75N (sense line potential) is maintained accurately at the bit line-applied voltage VBL. This is accomplished by the fact that the gate voltage VG of the NMOS transistor 75N is controlled by the negative feedback amplifier. This is accomplished further by the fact that the voltage held by the capacitor C is set in advance to (VBL+ΔVthg) so as to eliminate the impact of the threshold voltage of the differential input pair of the negative feedback amplifier.

Hence, the pulldown capability varies with change in magnitude of the cell current. As a result, a potential difference develops in the input voltage VIN between when the stored data is at high level and when it is at low level.

The differential sense amplifier DAMP senses this potential difference relative to the reference voltage VREF. This provides the output voltage VOUT at an amplitude level amplified according to the logic of the stored data (e.g., source voltage VDD or ground voltage GND). The input voltage VDD and output voltage VOUT exhibit the same waveforms as those from time T6 onward in FIG. 15H and FIG. 20H according to the first embodiment.

The present embodiment cancels the impact of variation in threshold voltage of the read gate transistor (NMOS transistor 75N) with the negative feedback amplifier. Further, the present embodiment eliminates the impact of the threshold voltage difference ΔVth between the first and second differential transistors 91N and 92N making up the differential input pair of the negative feedback amplifier. This prevents reduction in margin of the MR ratio of the memory cell MC, thus providing a semiconductor memory device highly immune to read disturb.

MODIFICATION EXAMPLE

The aforementioned first and second embodiments can be modified in various manners.

The bit line sense amplifier 7B illustrated in FIG. 14B and FIG. 25 can be modified as described below.

The NMOS transistor 76N is adapted to set the bit line-applied voltage VBL. To accurately accomplish the application of this voltage, it is necessary to replace the NMOS transistor 76N with a PMOS transistor or transfer gate. Further, the NMOS transistor 74N illustrated in FIG. 14B can be omitted if the bit line TGs 8B(0) to 8B(N) making up the column select switch circuit 8 in FIG. 7 can be controlled to function as the NMOS transistor 74N.

If, in the first embodiment, the precharge operation of the diode connection path of the NMOS transistor 75N by the precharge voltage VPRE is considered to be the reset function, the reset operation prior thereto is unnecessary. In that case, the PMOS transistor 71P and the NMOS transistor 71N can also be omitted.

It should be noted that, in the correspondence between the present invention and the embodiments, the "sense line" refers to the global bit line GBL or the line leading from the global bit line GBL to the source of the NMOS transistor 75N via the NMOS transistor 74N in the above operation example.

If the differential sense amplifier DAMP is omitted from the bit line sense amplifier 7B illustrated in FIG. 14B and FIG. 25, the resultant circuit is a current/voltage conversion circuit. This circuit is applicable not only to sense amplifiers but also widely to other types of circuitry.

Figure 26:
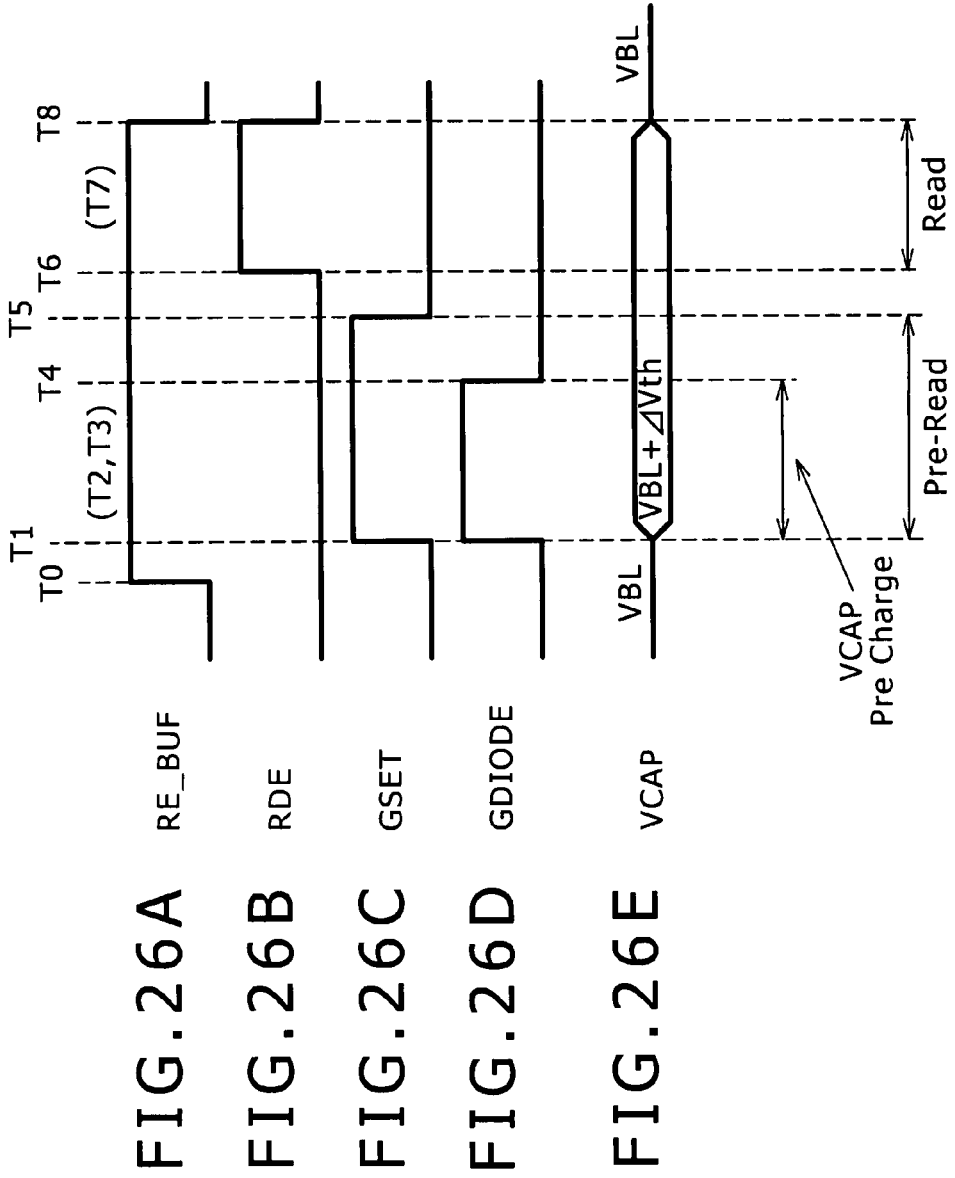
FIGS. 26A to 26E are waveform diagrams illustrating data read operation according to the second embodiment.
Figure 27:
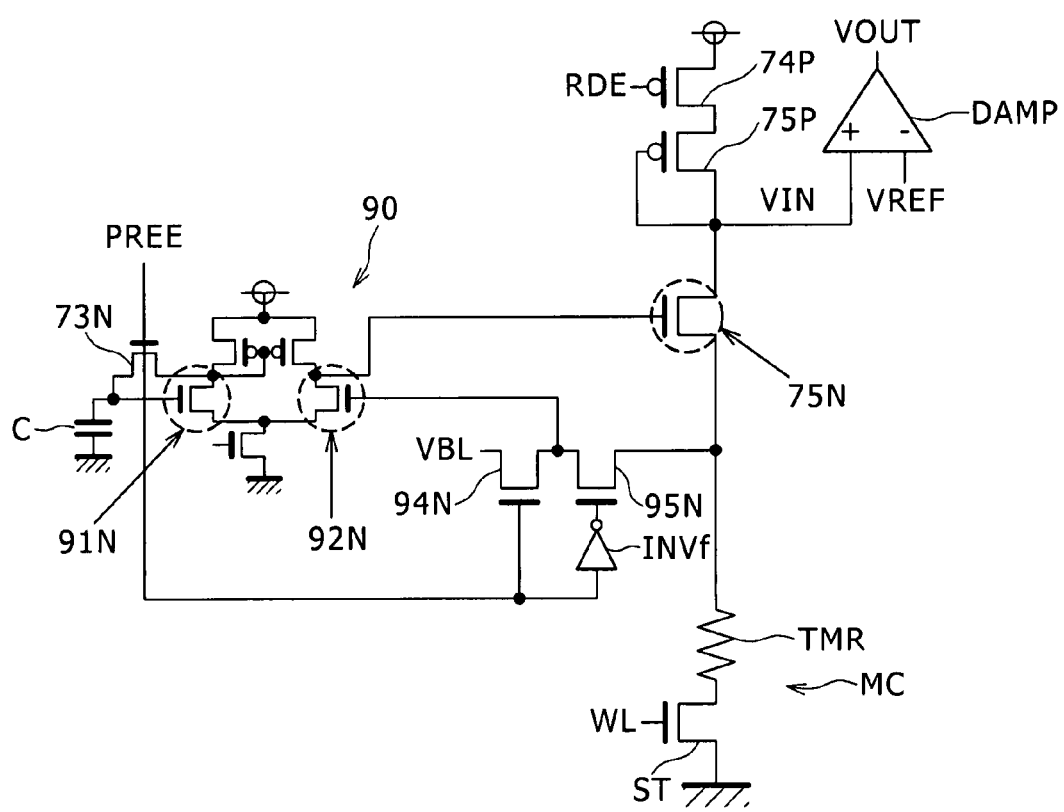
FIG. 27 is a circuit diagram illustrating a modification example of the bit line sense amplifier according to the second embodiment.

In the second embodiment, the NMOS transistors 73N, 94N and 95N can be controlled by a common signal (PREE) as illustrated in FIG. 27. In this case, the signal (PREE) having a pulse waveform is used in place of the signal (GSET) illustrated in FIG. 26C and the signal (GDIODE) illustrated in FIG. 26D. The signal (PREE) rises at time T1 and falls at time T4 or T5. It should be noted, however, that, as illustrated in FIG. 26, the operation is more reliable and therefore preferable if the signal (GDIODE) pulse is terminated before the signal (GSET) pulse.

Figure 28:
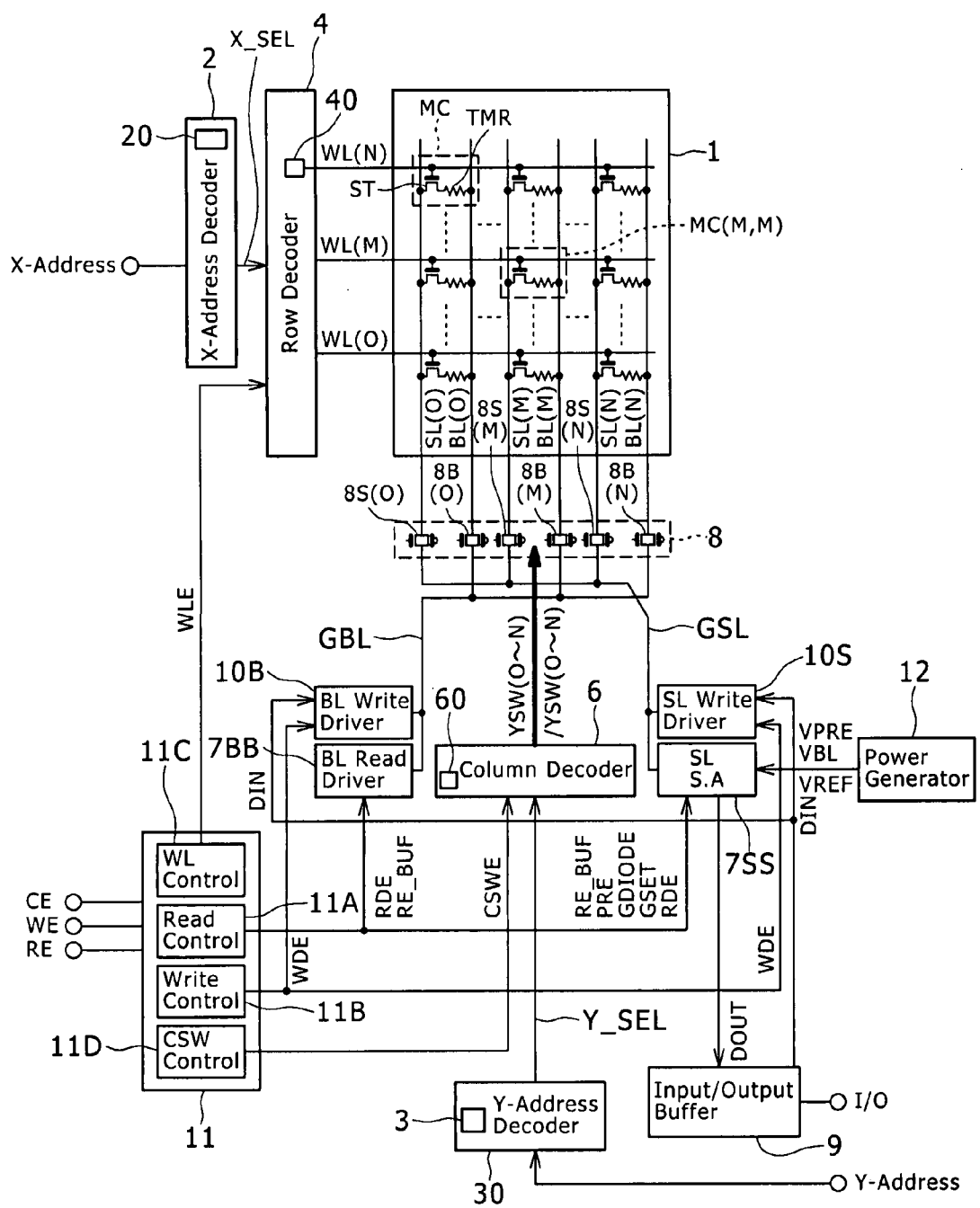
FIG. 28 is a block diagram illustrating a modification example of the layout in the first and second embodiments.

FIG. 28 illustrates a modification example of the semiconductor memory device illustrated in FIG. 7. This device has a source line sense amplifier (SL S.A) 7SS disposed on the side of the source line SL and a bit line read driver (BL Read Driver) 7BB disposed on the side of the bit line BL. This modification example is applicable both to the first and second embodiments.

With the exception of the connections with the global source line GSL and the global bit line GBL, the source line sense amplifier 7SS can be configured in the same manner as with the bit line sense amplifier 7B illustrated in FIG. 14B. Also, the bit line read driver 7BB can be configured in the same manner as with the source line read driver 7S illustrated in FIG. 14A.

In this case, in the correspondence between the present invention and the embodiments, the "sense line" refers to the global source line GSL or the line leading from the global source line GSL to the source of the NMOS transistor 75N via the NMOS transistor 74N.

Although described taking, as an example, spin injection memory, the present embodiment is also applicable to read operation of other proposed resistance change memories.

For example, the present embodiment is applicable to the phase change memory described in Japanese Patent Laid-Open No. 2001-127263.

The present embodiment is also applicable to the RRAM (resistance change random access memory using variable resistance material) described in Japanese Patent Application Laid-Open Publication No. 2004-260162.

Further, the present embodiment is applicable to the MRAM (magnetic random access memory) described in Japanese Patent Laid-Open No. 2002-197853.

Further, the bit line sense amplifier 7B (or source line sense amplifier 7SS) according to the present embodiment is widely applicable to memories in which the stored bit in the memory is associated with the presence or absence of a current flow through the sense line (or whether the current is large or small), and in which the presence or absence thereof or whether the current is large or small is detected.

In the case of a nonvolatile memory, for example, the memory transistor threshold voltage is varied by injecting charge into a floating gate FG, charge trap in nitride film or other charge accumulating means so as to produce the presence or absence of a current flow (or large or small current). In this case, as described earlier, a current/voltage conversion takes place as a result of a change in pull-down capability relative to a constant pull-up capability. Therefore, stored bit can be similarly detected by optimizing the reference voltage VREF applied to the differential sense amplifier DAMP. It should be noted that the present invention is applicable to memories other than variable resistance type nonvolatile memories, such as DRAM or SRAM, so long as the presence or absence of a current flow (or large or small current) is produced in accordance with the stored bit.

As described in the operational description, the operation may be performed in a non-saturated region due to the gate voltage VG. Even in the presence of a variation in characteristics, and particularly in threshold voltage, of the transistor connected to the flow path of the cell current Icell (NMOS transistor 75N) between the different sense amplifier circuits, the variation is fed back in a self-referenced manner as the gate voltage VG. This makes it possible to cancel the impact of the variation in characteristic (threshold voltage). In addition, the second embodiment can eliminate the impact of a threshold voltage difference between the transistors making up the negative feedback amplifier. This provides an improved read margin (e.g., MR ratio margin), effectively preventing read disturb and other malfunction.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor memory device, comprising:
   a memory cell;
   a sense line; and
   a sense amplifier circuit connected to the memory cell via the sense line; wherein
   the sense amplifier circuit includes
   a differential sense amplifier having first and second differential inputs and whose second differential input is supplied with a reference voltage,
   a pull-up section adapted to pull up the first differential input to a constant voltage,
   a read gate transistor connected between the sense line and the first differential input, and adapted to turn on if the sense line potential drops below an initial voltage in response to a cell current, and
   a threshold correction section adapted to generate a voltage corrected from the initial voltage by making or breaking a diode connection of a given transistor, the impact of whose threshold voltage on the sense line potential is to be eliminated, and also adapted to apply the corrected voltage to the control terminal of the read gate transistor.

2. The semiconductor memory device of claim 1, the sense amplifier circuit, comprising:
the differential sense amplifier having first and second differential inputs and whose second differential input is supplied with the reference voltage;
the pull-up section adapted to pull up the first differential input to the constant voltage;
a diode connection switch circuit section having the read gate transistor which is connected between the first differential input and the sense line and is capable of controlling the making and breaking of a diode connection by shorting the first differential input and the control terminal; and
a charge/discharge switch circuit section adapted to precharge a diode connection path in a diode connection state to bring the path into a floating state and also adapted to discharge part of a precharge voltage to the supply line of the initial voltage according to the threshold voltage of the read gate transistor; wherein
the sense amplifier circuit breaks the diode connection to sense the voltage of the first differential input with the differential sense amplifier.

3. The semiconductor memory device of claim 2, wherein the charge/discharge switch circuit section sets the first differential input to a voltage level equal to the initial voltage plus the threshold voltage by bringing a diode connection path in a diode connection state into a floating state after setting a precharge voltage, electrically connecting the sense line to the supply line of the initial voltage, and discharging part of the precharge voltage to the supply line of the initial voltage until the read gate transistor is brought into cutoff.

4. The semiconductor memory device of claim 2, wherein the connection between the sense line and the supply line of the initial voltage and the diode connection are both broken,
a voltage, maintained at the first differential input in a floating state, is supplied to the memory cell via the read gate transistor in cutoff, and
the voltage, maintained at the first differential input, which changes with change in a current flowing through the memory cell, is sensed.

5. The semiconductor memory device of claim 2, the diode connection switch circuit section including:
a first transistor serving as the read gate transistor; and
a second transistor connected between the connection terminal of the first differential input of the first transistor and the control terminal,
the charge/discharge switch circuit section including
a third transistor connected between the supply line of the precharge voltage and the first differential input, and
a fourth transistor connected between the source of the first transistor electrically connected to the sense line and the supply line of the initial voltage.

6. The semiconductor memory device of claim 5, wherein the pull-up section adapted to pull up the potential of the first differential input comprises a fifth transistor adapted to turn on to secure a power supply path during voltage sensing by the differential sense amplifier.

7. The semiconductor memory device of claim 2, wherein the precharge voltage is higher than the initial voltage by a threshold voltage of the read gate transistor or more.

8. The semiconductor memory device of claim 1, the threshold correction section, comprising:

a differential amplifier having two differential transistors which make up a differential input pair;
an initial voltage setting section adapted to set, to the initial voltage, the control terminal of one of the differential transistors of the differential amplifier;
a negative feedback circuit section adapted to set the other differential transistor of the differential amplifier to the initial voltage for connection to the sense line in a floating state; and
a diode connection control section adapted to control the making and breaking of a diode connection of one of the differential transistors.

9. A sense amplifier circuit adapted to detect the voltage of a sense line which varies according to a current flowing through the sense line when the sense line is in a potentially floating state following the application of a given initial voltage to this line, the sense amplifier circuit, comprising:
a differential sense amplifier having first and second differential inputs and whose second differential input is supplied with a reference voltage;
a pull-up section adapted to pull up the first differential input to a constant voltage;
a read gate transistor connected between the sense line and the first differential input, and adapted to turn on if the sense line potential drops below an initial voltage in response to a cell current; and
a threshold correction section adapted to generate a voltage corrected from the initial voltage by making or breaking a diode connection of a given transistor, the impact of whose threshold voltage on the sense line potential is to be eliminated, and also adapted to apply the corrected voltage to the control terminal of the read gate transistor.

10. The sense amplifier circuit of claim 9, comprising:
a diode connection switch circuit section having the read gate transistor which is connected between the first differential input and the sense line and is capable of controlling the making and breaking of a diode connection by shorting the first differential input and the control terminal; and
a charge/discharge switch circuit section adapted to precharge a diode connection path in a diode connection state to bring the path into a floating state and also adapted to discharge part of a precharge voltage to the supply line of the initial voltage according to the threshold voltage of the read gate transistor; wherein
the diode connection is broken to sense the voltage of the first differential input.

11. The sense amplifier circuit of claim 9, the threshold correction section, comprising:
a differential amplifier having two differential transistors which make up a differential input pair;
an initial voltage setting section adapted to set, to the initial voltage, the control terminal of one of the differential transistors of the differential amplifier;
a negative feedback circuit section adapted to set the other differential transistor of the differential amplifier to the initial voltage for connection to the sense line in a floating state; and
a diode connection control section adapted to control the making and breaking of a diode connection of one of the differential transistors.

12. A memory cell reading method operable to read stored data from a memory cell via a read gate transistor which is connected between a sense line and a sense node and which turns on if the sense line potential drops below an initial voltage in response to a cell current, the memory cell reading method, comprising the steps of:

generating a voltage corrected from the initial voltage by making or breaking a diode connection of a given transistor, the impact of whose threshold voltage on the sense line potential is to be eliminated, applying the corrected voltage to the control terminal of the read gate transistor, and setting the sense line to the initial voltage to bring the line into a floating state; and detecting the change in the sense node potential which changes with the cell current by connecting the sense line, pulled up to a constant voltage, to the memory cell and comparing the change in the sense node potential with a reference voltage.

13. The memory cell reading method of claim 12, the voltage setting step, further comprising the steps of:

diode-connecting the read gate transistor by connecting the control terminal thereof to the sense node and precharging a diode connection path to bring the path into a floating state;

electrically connecting the sense line to the supply line of an initial voltage and discharging part of the precharge voltage to the supply line of the initial voltage until the read gate transistor is brought into cutoff; and breaking the connection between the sense line and the supply line of the initial voltage.

14. The memory cell reading method of claim 13, wherein the sensing step supplies a voltage, which is maintained at the sense node in a floating state, to the memory cell via the read gate transistor in cutoff, with both the connection between the sense line and the initial voltage supply line and the diode connection broken, and the sensing step senses the voltage maintained at the sense node which changes with change in a current flowing through the memory cell.

15. The memory cell reading method of claim 12, wherein the voltage setting step controls a control voltage of the read gate transistor through negative feedback amplification so as to bring the sense line voltage equal to the initial voltage using a differential amplifier having first and second differential transistors as a differential input pair, prior to the negative feedback amplification, the voltage setting step, comprising the steps of:

supplying a constant voltage higher than the initial voltage to the drain of the first differential transistor and the drain of the second differential transistor to which the control terminal of the read gate transistor is connected so as to maintain the drains in a floating state;

setting the control terminal of the first differential transistor to the initial voltage;

disconnecting the control terminal of the second differential transistor from the sense line to interrupt a negative feedback loop and maintain the control terminal, disconnected from the sense line, at the initial voltage;

diode-connecting the first differential transistor to reduce the control voltage of the first differential transistor to a voltage commensurate with the difference in threshold voltage between the first and second differential transistors so as to drive the first differential transistor into cutoff; and connecting the control terminal of the second differential transistor to the sense line to form the negative feedback loop.

* * * * *